(12) United States Patent
Matsumoto et al.

(10) Patent No.: US 9,514,839 B2
(45) Date of Patent: Dec. 6, 2016

(54) NONVOLATILE MEMORY, NONVOLATILE PROGRAMMABLE LOGIC SWITCH INCLUDING NONVOLATILE MEMORY, AND NONVOLATILE PROGRAMMABLE LOGIC CIRCUIT

(71) Applicant: KABUSHIKI KAISHA TOSHIBA, Tokyo (JP)

(72) Inventors: Mari Matsumoto, Kanagawa (JP); Kosuke Tatsumura, Kanagawa (JP); Koichiro Zaitsu, Kanagawa (JP); Shinichi Yasuda, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/726,884

(22) Filed: Jun. 1, 2015

(65) Prior Publication Data

US 2015/0348631 A1 Dec. 3, 2015

(30) Foreign Application Priority Data

Jun. 3, 2014 (JP) .................. 2014-115111

(51) Int. Cl.
*G11C 17/16* (2006.01)
*H01L 27/112* (2006.01)
*G11C 16/10* (2006.01)

(52) U.S. Cl.
CPC .............. *G11C 17/16* (2013.01); *G11C 16/10* (2013.01); *H01L 27/11206* (2013.01)

(58) Field of Classification Search
CPC ..... G11C 17/16; G11C 16/0466; G11C 16/10; H01L 29/7887; H01L 27/11524; H01L 27/1157; H01L 29/7923; H01L 21/6835; H03K 19/17704
See application file for complete search history.

(56) References Cited

U.S. PATENT DOCUMENTS

| | | | |
|---|---|---|---|
| 5,537,056 A | 7/1996 | McCollum | |
| 6,002,610 A | 12/1999 | Cong et al. | |
| 6,667,902 B2 | 12/2003 | Peng | |
| 7,093,225 B2* | 8/2006 | Osann ................ | G06F 17/5054 438/129 |
| 7,715,219 B2 | 5/2010 | Monreal | |
| 7,764,541 B2 | 7/2010 | Kohler et al. | |
| 8,405,443 B2* | 3/2013 | Sugiyama ............ | H01L 27/112 326/38 |
| 8,432,186 B1 | 4/2013 | Zaitsu et al. | |
| 8,884,648 B2 | 11/2014 | Zaitsu et al. | |

(Continued)

FOREIGN PATENT DOCUMENTS

| | | |
|---|---|---|
| JP | 2007-522655 | 8/2007 |
| JP | 2011-527065 | 10/2011 |
| JP | 2013-165466 | 8/2013 |

*Primary Examiner* — J. H. Hur
*Assistant Examiner* — Ajay Ojha
(74) *Attorney, Agent, or Firm* — Finnegan, Henderson, Farabow, Garrett & Dunner LLP

(57) ABSTRACT

A nonvolatile memory according to an embodiment includes a memory cell, the memory cell including: a memory transistor including a source, a drain, a gate electrode disposed above a channel between the source and the drain, and a gate insulating film disposed between the channel and the gate electrode; and a fuse element disposed between the gate electrode and a wiring line to which the gate electrode of the memory transistor is connected.

17 Claims, 23 Drawing Sheets

(56) References Cited

U.S. PATENT DOCUMENTS

| | | | |
|---|---|---|---|
| 2009/0146189 A1* | 6/2009 | Madurawe | G11C 5/063 257/203 |
| 2014/0061765 A1* | 3/2014 | Zaitsu | G11C 16/10 257/324 |
| 2014/0268984 A1* | 9/2014 | Yanagisawa | G11C 17/16 365/96 |

* cited by examiner

NONVOLATILE MEMORY, NONVOLATILE PROGRAMMABLE LOGIC SWITCH INCLUDING NONVOLATILE MEMORY, AND NONVOLATILE PROGRAMMABLE LOGIC CIRCUIT

CROSS REFERENCE TO RELATED APPLICATIONS

This application is based upon and claims the benefit of priority from prior Japanese Patent Application No. 2014-115111 filed on Jun. 3, 2014 in Japan, the entire contents of which are incorporated herein by reference.

FIELD

Embodiments described herein relate generally to a nonvolatile memory, a nonvolatile programmable logic switch including a nonvolatile memory, and a nonvolatile programmable logic circuit

BACKGROUND

Programmable logic switches are included in field programmable gate arrays (FPGAs) in which logical operation circuits and wire circuits may need to be reconfigured, and switch ON and OFF logic switches based on data stored in memories. Volatile memories such as static random access memories (SRAMs) have been used as the aforementioned memories. The data stored in volatile memories are erased if the power is turned OFF. Therefore, data should be rewritten to the memories when the power is turned ON again.

Some methods are known in which nonvolatile flash memories are included in programmable logic switches. In an example of the above methods, the memory of a programmable logic switch includes cells each including two nonvolatile memory elements and one switching transistor (pass transistor). Flash memory elements, for example, are used as the nonvolatile memory elements. A power supply voltage or 0 V is applied to the gate the switching transistor via either of the two flash memory elements. A programmable logic switch with such a memory configuration has a smaller area than a programmable logic switch including SRAMs.

Other methods are also known in which anti-fuse elements are included in FPGAs. These methods electrically connect a plurality of wiring lines by changing the resistances of specific anti-fuse elements to lower values, thereby achieving various circuits.

Wiring lines in FPGAs of this type are connected or disconnected irreversibly. Thus, circuit information is not changed unexpectedly. This enables FPGAs of this type to be used in an environment where FPGAs with flash memories may not be used. However, basically the programming of logic information can be performed only once for the FPGAs of this type since the wiring lines once connected cannot be disconnected.

DETAILED DESCRIPTION

A nonvolatile memory according to an embodiment includes a memory cell, the memory cell including: a memory transistor including a source, a drain, a gate electrode disposed above a channel between the source and the drain, and a gate insulating film disposed between the channel and the gate electrode; and a fuse element disposed between the gate electrode and a wiring line to which the gate electrode of the memory transistor is connected.

Embodiments will now be explained with reference to the accompanying drawings.

First Embodiment

Figure 1:
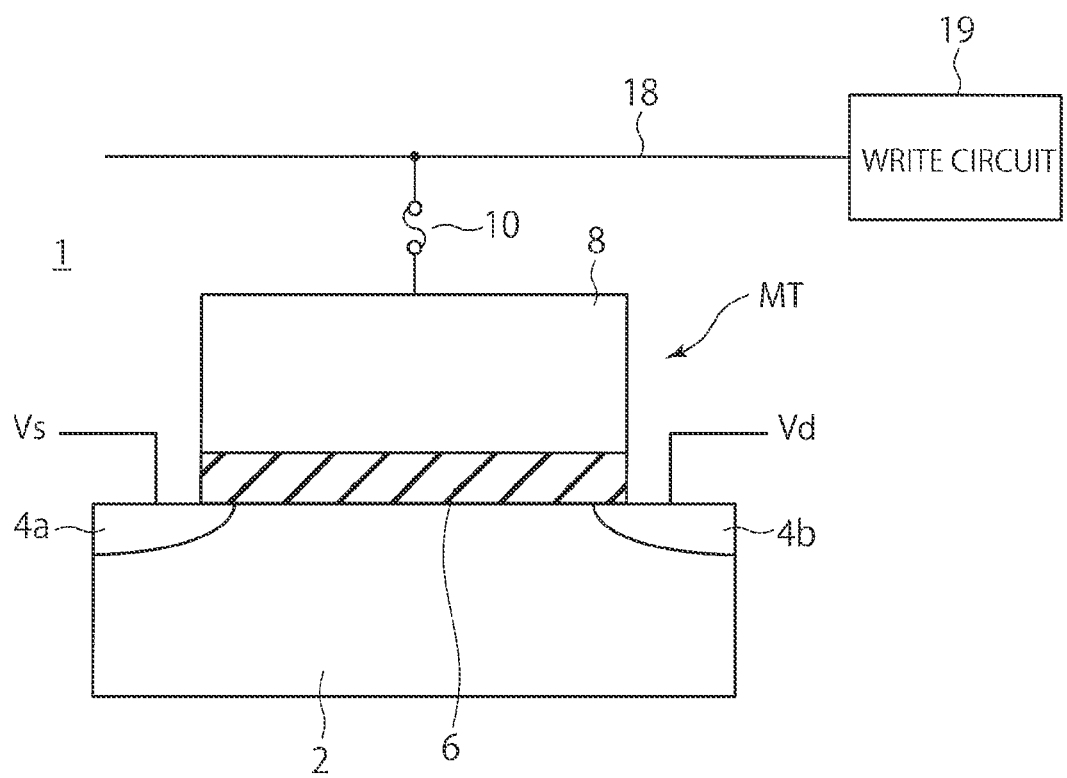
FIG. 1 is a diagram showing a nonvolatile memory according to a first embodiment.

A nonvolatile memory according to a first embodiment will be described with reference to FIG. 1. The nonvolatile memory according to the first embodiment includes at least one memory cell, which is shown in FIG. 1. The memory cell 1 includes a memory transistor MT and a fuse element 10. The memory transistor MT includes a semiconductor layer 2, a source region 4a and a drain region 4b disposed in the semiconductor layer 2 to be separated from each other, a gate insulating film 6 disposed on a region of the semiconductor layer 2 between the source region 4a and the drain region 4b, the region serving a channel region, and a gate electrode 8 disposed on the gate insulating film 6. Thus, the memory transistor MT is a common metal-oxide-semiconductor (MOS) transistor. The gate electrode 8 is connected to a wiring line 18 via the fuse element 10.
(Write Method)

A method of writing data to (programming) the memory cell 1 will be described below. In a write operation, a voltage Vs applied to the source region 4a and a voltage Vd applied to the drain region 4b are set to a ground voltage, and a program voltage Vprg is applied to the gate electrode 8 via the wiring line 18 and the fuse element 10 by a write circuit 19. This causes a breakdown of the gate insulating film 6 of the memory transistor MT to electrically connect the source region 4a and the drain region 4b via the gate Insulating film 6 that is broken down and the gate electrode 8. As a result, a conductive path is formed through the source region 4a, the gate insulating film 6 that is broken down, the gate electrode 8, and the drain region 4b. A voltage is then applied to the gate electrode 8 via the wiring line 18 and the fuse element 10 to cause a current to flow through the wiring line 18, the fuse element 10, the gate electrode 8, the gate insulating film 6, and the source region 4a and the drain region 4b. The current causes a voltage capable of blowing out (rupturing) the fuse element 10 to be applied to the wiring line 18. This voltage breaks the fuse element 10 to prevent the current from flowing between the wiring line 18 and the gate electrode 8. The write operation to the memory cell 1 ends in this manner. The voltage to blow out the fuse element 10 may be the program voltage Vprg, a voltage that is higher than the program voltage Vprg, or a voltage that is lower than the program voltage Vprg. As the voltage to blow out the fuse element 10 becomes higher, the time required to blow out the fuse element 10 becomes shorter, and as the voltage becomes lower, the time becomes longer.

In the programmed memory cell 1, a conductive path exists for connecting the source region 4a and the drain region 4b through the gate insulating film 6 and the gate electrode 8. Thus, the resistance between the source region 4a and the drain region 4b becomes low. This makes the memory transistor MT of the programmed memory cell 1 become a two-terminal element, in which the source and the drain are connected via the gate insulating film and the gate electrode. The resistance between the source region 4a and the drain region 4b in an unprogrammed memory cell 1 is high since the gate insulating film 6 is not broken down. In this case, the memory transistor MT is a three-terminal element.

Although the memory transistor MT according to the first embodiment is a versatile MOS transistor with a gate structure including a gate insulating film and a gate electrode, a transistor including a gate insulating film formed of a high-k material may also be used. A transistor with a metal-oxide-nitride-oxide (MONOS) gate structure may also be used.
(Fuse Element)

Specific examples of the fuse element 10 will be described below with reference to FIGS. 2 to 6.

Figure 2:
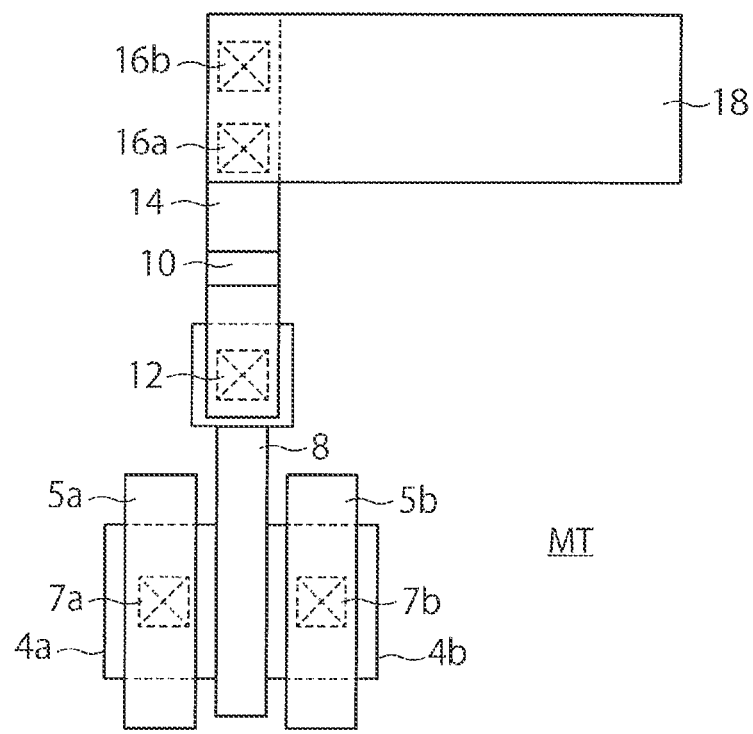
FIG. 2 is a layout diagram showing a first specific example of a fuse element of the nonvolatile memory according to the first embodiment.

FIG. 2 shows a first specific example of the fuse element 10. The fuse element 10 according to the first specific example is disposed on a connection wiring line 14 between the gate electrode 8 of the memory transistor MT and the wiring line 18 connecting to the gate electrode 8. The fuse element 10 has the same width (the size in the lateral direction in FIG. 2) and the same thickness (the size in the depth direction in FIG. 2) as the connection wiring line 14, and formed of a material with a lower melting point than the melting point of the connection wiring line 14. Examples of the material of the fuse element 10 include SnSb, BiSn, SnAg, ZnAl, and InSn. The connection wiring line 14 is connects to the gate electrode 8 via a contact 12, and the wiring line 18 via contacts 16a, 16b. The source region 4a of the memory transistor MT connects to a source electrode 5a via a contact 7a, and the drain region 4b connects to a drain electrode 5b via a contact 7b. In writing data to a memory cell, a ground voltage is applied to the source electrode 5a and the drain electrode 5b.

Figure 3:
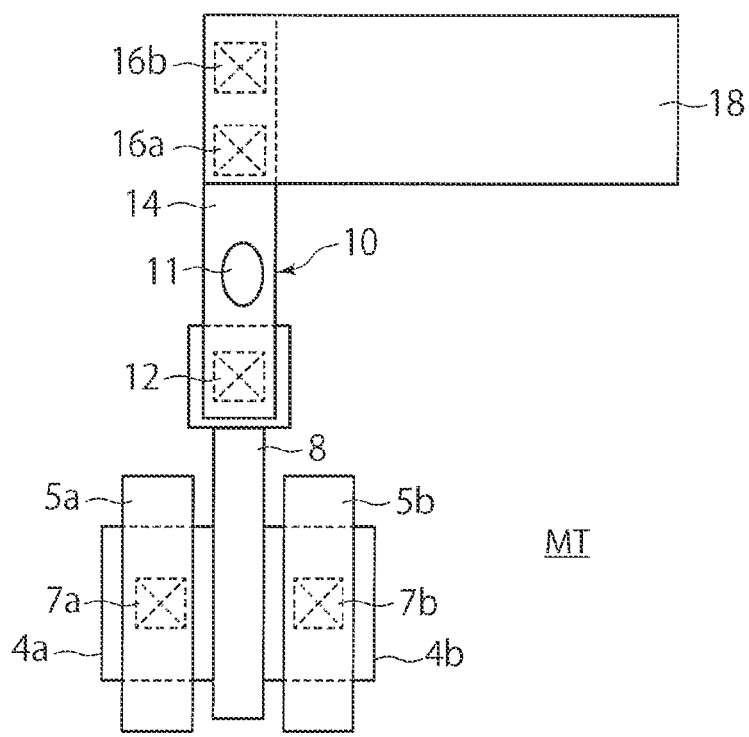
FIG. 3 is a layout diagram showing a second specific example of the fuse element of the nonvolatile memory according to the first embodiment.

FIG. 3 shows a second specific example of the fuse element 10. The fuse element 10 according to the second specific example has an opening 11 in the connection wiring line 14 between the gate electrode 8 of the memory transistor MT and the wiring line 18 connecting to the gate electrode 8, the opening penetrating the connection wiring line 14 in a thickness direction. This makes the cross-sectional area of the connection wiring line 14 with the fuse element 10 smaller than that of the connection wiring 14 without the fuse element 10.

Figure 4:
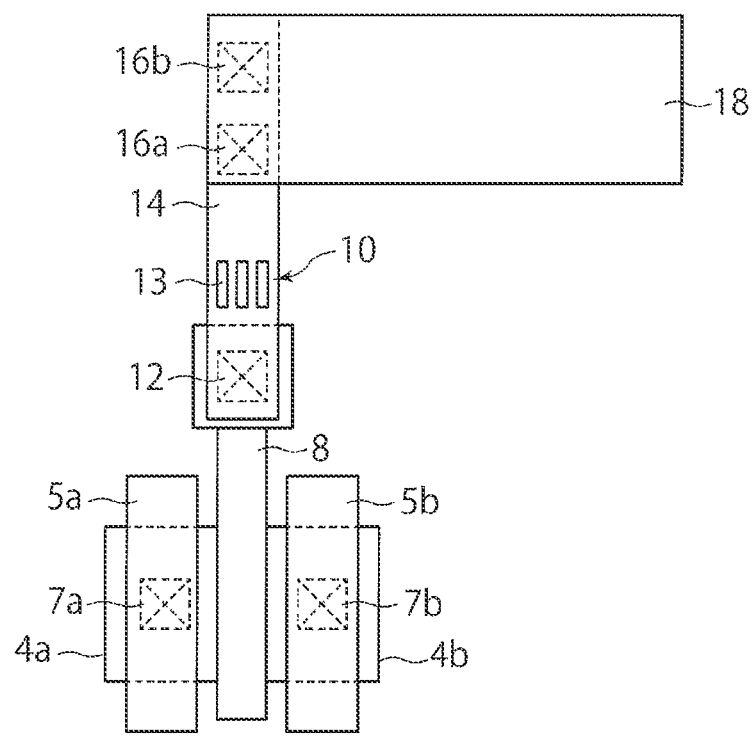
FIG. 4 is a layout diagram showing a third specific example of the fuse element of the nonvolatile memory according to the first embodiment.

FIG. 4 shows a third specific example of the fuse element 10. The fuse element 10 according to the third specific example has a plurality of openings 13 in the connection wiring line 14 between the gate electrode 8 of the memory transistor MT and the wiring line 18 connecting to the gate electrode 8, the openings 13 being disposed in a direction along which the connection wiring line 14 extends, and penetrating the connection wiring line 14 in a thickness direction. This makes the cross-sectional area of the connection wiring line 14 with the fuse element 10 smaller than that of the connection wiring 14 without the fuse element 10.

Figure 5:
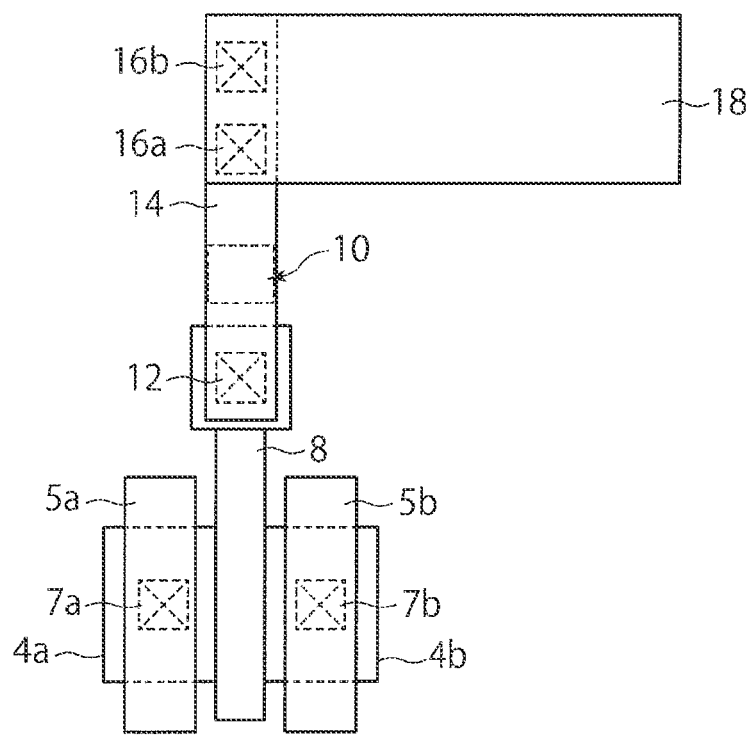
FIG. 5 is a layout diagram showing a fourth specific example of the fuse element of the nonvolatile memory according to the first embodiment.

FIG. 5 is a fourth specific example of the fuse element 10. The fuse element 10 according to the fourth specific example is disposed in the connection wiring line 14 between the gate electrode 8 of the memory transistor MT and the wiring line 18 connecting to the gate electrode 8. The fuse element 10 is formed of the same material as the connection wiring line 14, has the same width (the size in the lateral direction in FIG. 5) as the connection wiring line 14, and has a thickness (the size in the depth direction in FIG. 5) thinner than that of the connection wiring line 14. This makes the cross-sectional area of the connection wiring line 14 with the fuse element 10 smaller than that of the connection wiring line 14 without the fuse element 10.

Figure 6:
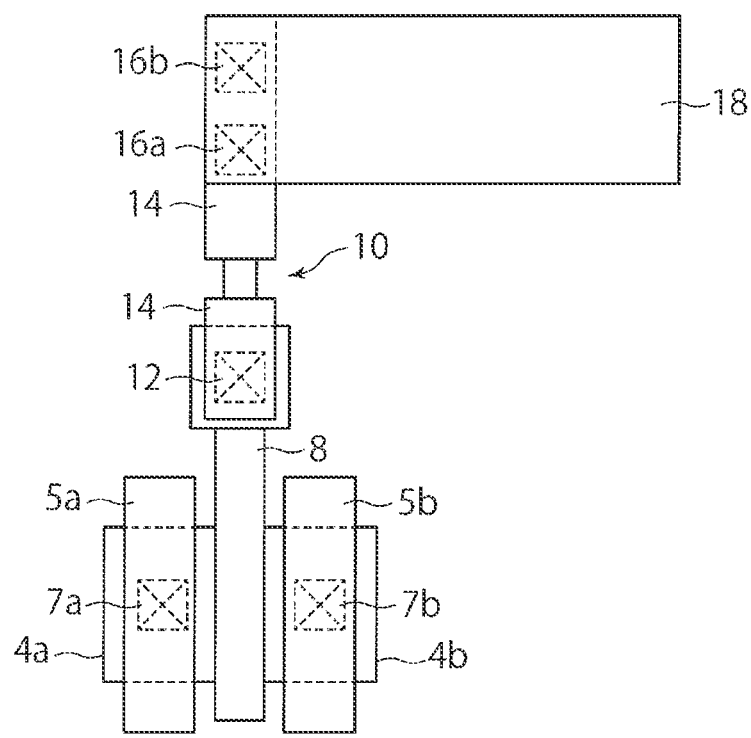
FIG. 6 is a layout diagram showing a fifth specific example of the fuse element of the nonvolatile memory according to the first embodiment.

FIG. 6 shows a fifth specific example of the fuse element 10. The fuse element 10 of the fifth specific example is disposed in the connection wiring line 14 between the gate electrode 8 of the memory transistor MT and the wiring line 18 connecting to the gate electrode 8. The fuse element 10 is formed of the same material as the connection wiring line 14, has the same thickness (the size in the depth direction in FIG. 6) as the connection wiring line 14, and has a width (the size in the lateral direction in FIG. 6) thinner than that of the connection wiring line 14. This makes the cross-sectional area of the connection wiring line 14 with the fuse element 10 smaller than that of the connection wiring line 14 without the fuse element 10.

The rupturing of the fuse element 10 in each of the second specific example to the fifth specific example is caused by electromigration.

Figure 24:
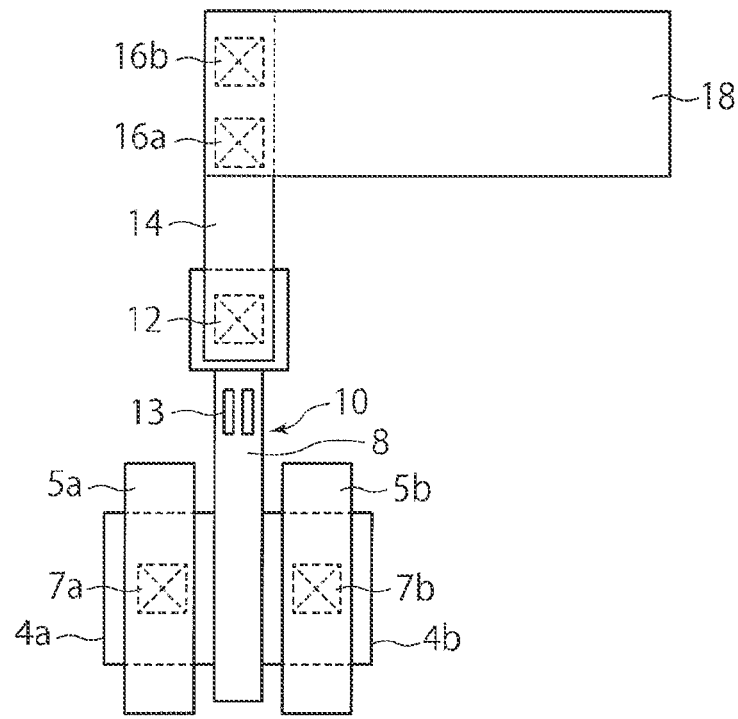
FIG. 24 is a layout diagram showing a sixth specific example of the fuse element of the nonvolatile memory according to the first embodiment.

FIG. 24 shows a sixth specific example of the fuse element 10. The fuse element 10 according to the sixth specific example has a plurality of openings 13 in the gate electrode 8 of the memory transistor MT, the openings 13 being disposed in a direction along which the gate electrode 8 extends, and penetrating the gate electrode 8 in a thickness direction. This makes the cross-sectional area of the gate electrode 8 with the fuse element 10 smaller than that of the gate electrode 8 without the fuse element 10.

Figure 25:
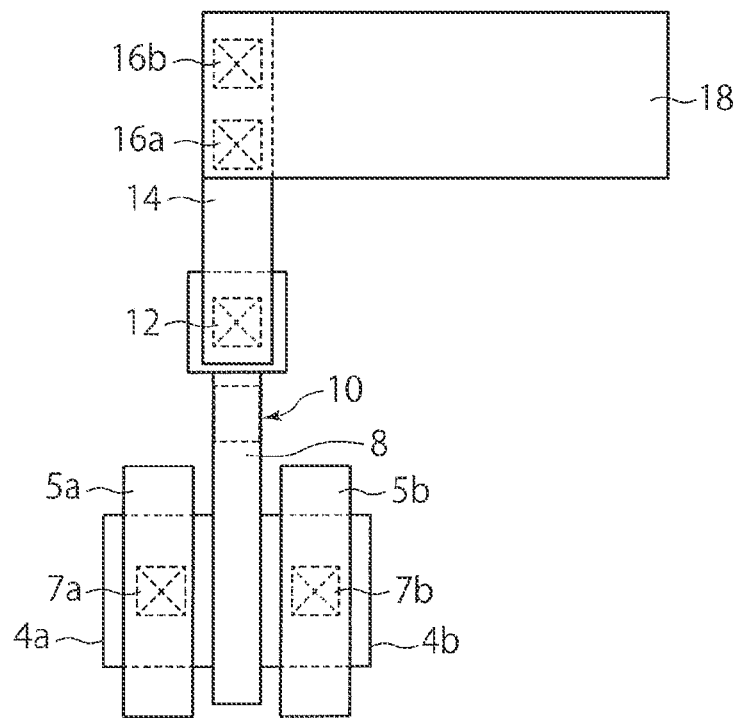
FIG. 25 is a layout diagram showing a seventh specific example of the fuse element of the nonvolatile memory according to the first embodiment.

FIG. 25 is a seventh specific example of the fuse element 10. The fuse element 10 according to the seventh specific example is disposed in the gate electrode 8 of the memory transistor MT. The fuse element 10 is formed of the same material as the gate electrode 8, has the same width (the size in the lateral direction in FIG. 25) as the gate electrode 8, and has a thickness (the size in the depth direction in FIG. 25) thinner than that of the gate electrode 8. This makes the cross-sectional area of the gate electrode 8 with the fuse element 10 smaller than that of the gate electrode 8 without the fuse element 10.

Figure 26:
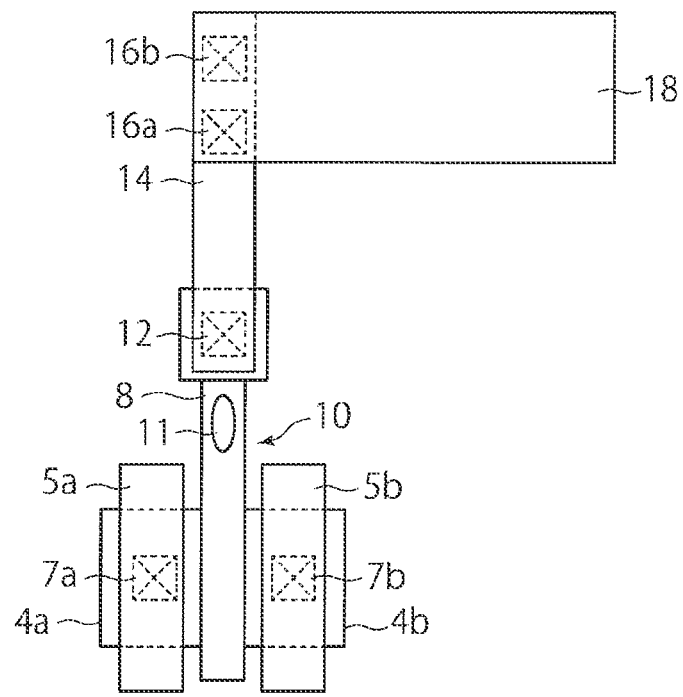
FIG. 26 is a layout diagram showing an eighth specific example of the fuse element of the nonvolatile memory according to the first embodiment.

FIG. 26 shows an eighth specific example of the fuse element 10. The fuse element 10 according to the eighth specific example has an opening 11 in the gate electrode 8 of the memory transistor MT, the openings 11 being disposed in a direction along which the gate electrode 8 extends, and penetrating the gate electrode 8 in a thickness direction. This makes the cross-sectional area of the gate electrode 8 with the fuse element 10 smaller than that of the gate electrode 8 without the fuse element 10.

Figure 27:
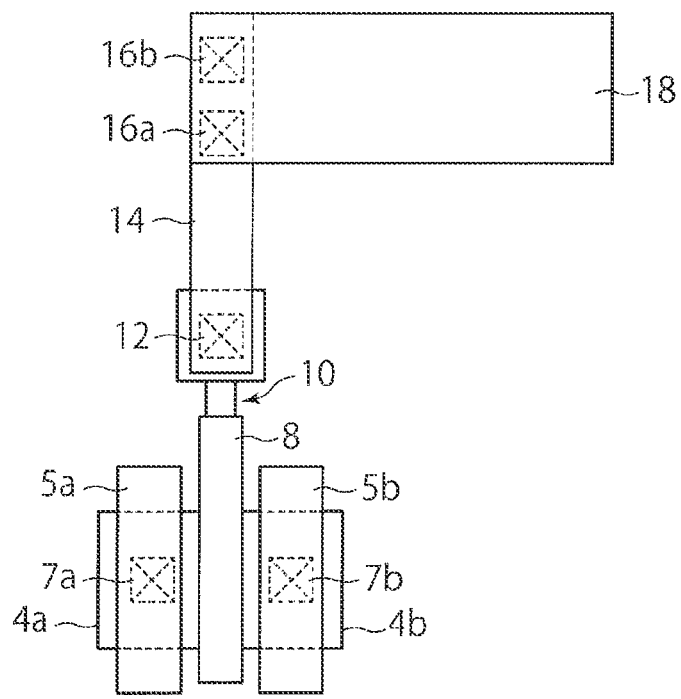
FIG. 27 is a layout diagram showing a ninth specific example of the fuse element of the nonvolatile memory according to the first embodiment.

FIG. 27 shows a ninth specific example of the fuse element 10. The fuse element 10 of the ninth specific example is disposed in the gate electrode 8 of the memory transistor MT. The fuse element 10 is formed of the same material as the gate electrode 8, has the same thickness (the size in the depth direction in FIG. 27) as the gate electrode 8, and has a width (the size in the lateral direction in FIG. 27) thinner than that of the gate electrode 8. This makes the cross-sectional area of the gate electrode 8 with the fuse element 10 smaller than that of the gate electrode 8 without the fuse element 10.

In the following descriptions, the source region or the source electrode may be simply called "source," and the drain region or the drain electrode may be simply called "drain."

(First Modification)

Figure 7:
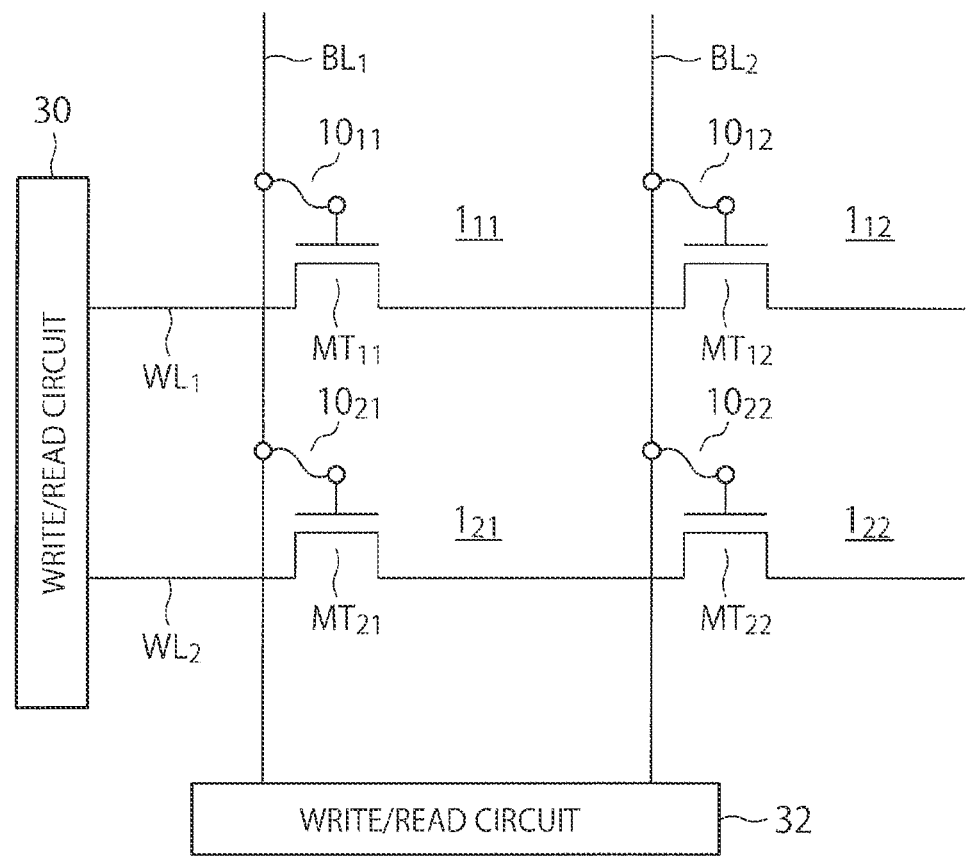
FIG. 7 is a circuit diagram showing a nonvolatile memory according to a first modification of the first embodiment.

FIG. 7 shows a nonvolatile memory according to a first modification of the first embodiment. The nonvolatile memory according to the first modification includes a plurality of memory cells $1_{11}$-$1_{22}$ arranged in a matrix form with rows and columns, write/read circuits 30, 32, bit lines $BL_1$, $BL_2$, and word lines $WL_1$, $WL_2$. Each memory cell $1_{ij}$ (i, j=1, 2) has the same structure as the memory cell 1 shown in FIG. 1, and thus includes a memory transistor $MT_{ij}$ and a fuse element $10_{ij}$. The memory transistors $MT_{11}$, $MT_{12}$ in the first row are connected in series. One of the source and the drain of the memory transistor $MT_{11}$ is connected to a word line $WL_1$. The memory transistors $MT_{21}$, $MT_{22}$ in the second row are connected in series. One of the source and the drain of the memory transistor $MT_{21}$ is connected to a word line $WL_2$. The word lines $WL_1$, $WL_2$ are driven by the write/read circuit 30.

The gate electrodes of the memory transistors $MT_{i1}$ (i=1, 2) in the first column are connected to the bit line $BL_1$ via the fuse elements $10_{i1}$. The gate electrodes of the memory transistors $MT_{i2}$ (i=1, 2) in the second column are connected to the bit line $BL_2$ via the fuse elements $10_{i2}$. The bit lines $BL_1$, $BL_2$ are driven by the write/read circuit 32.

(Write Operation)

Figure 8:
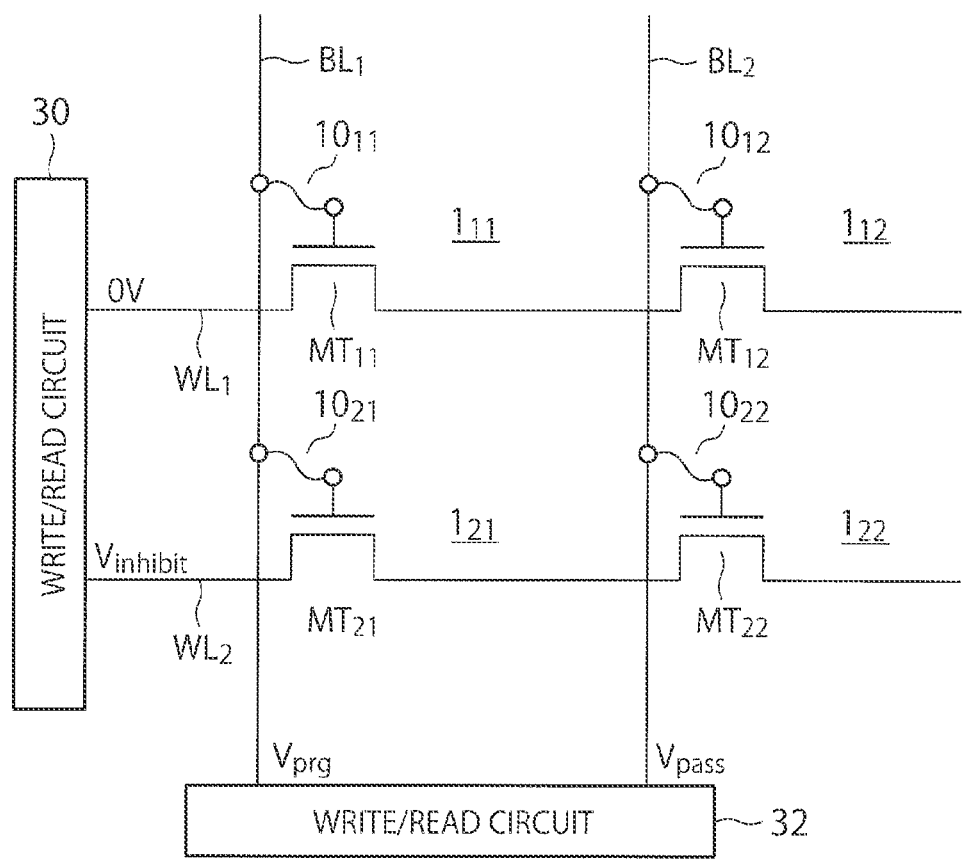
FIG. 8 is an explanatory diagram illustrating a write operation of the nonvolatile memory according to the first modification of the first embodiment.

A write operation of the nonvolatile memory according to the first modification will be described with reference to FIG. 8, which shows voltages to be applied to the word lines $WL_1$, $WL_2$ and the bit lines $BL_1$, $BL_2$ when the memory cell $1_{11}$ is to be programmed. A voltage Vss (0 V) is applied to the word line $WL_1$ and a write inhibiting voltage Vinhibit is applied to the word line $WL_2$ by the write/read circuit 30. A voltage Vpass for turning ON the memory transistor is applied to the bit line $BL_2$ by the write/read circuit 32. As a result, the memory transistors $MT_{12}$, $MT_{22}$ are turned ON to apply a voltage 0 V to the sources and the drains of the memory transistor $MT_{11}$, $MT_{12}$, and a write inhibiting voltage Vinhibit to the sources and the drains of the memory transistors $MT_{21}$, $MT_{22}$. Thereafter, a program voltage Vprg is applied to the bit line $BL_1$ by the write/read circuit 32. As a result, the program voltage Vprg is applied between the gate electrode and the source and the drain of the memory transistor $MT_{11}$ to cause breakdown of the gate insulating film thereof. This forms a conductive path between the source and the drain via the gate insulating film and the gate electrode in the memory transistor $MT_{11}$. The program voltage Vprg is kept being applied to the bit line $BL_1$ by the write/read circuit 32 to cause a current to flow from the bit line $BL_1$ to the source and the drain of the memory transistor $MT_{11}$ through the fuse element $10_1$ and the gate electrode and the gate insulating film of the memory transistor $MT_{11}$. The current blows out the fuse element $10_{11}$, thereby writing data to the memory transistor $MT_{11}$. As a result, the memory transistor $MT_{11}$ becomes a two-terminal element in which the source and the drain are electrically connected to each other via the gate insulating film and the gate electrode. The write inhibiting voltage Vinhibit is set such that a voltage "Vprg-Vinhibit" applied to the gate insulating film when a program voltage Vprg is applied to the gate of the memory transistor does not break down the gate insulating film.

If one of the memory cells on the same row is programmed in the nonvolatile memory according to the first modification, the other memory cells cannot be programmed. In other words, more than one memory cell in the same row cannot be programmed.

(Read Operation)

Figure 9:
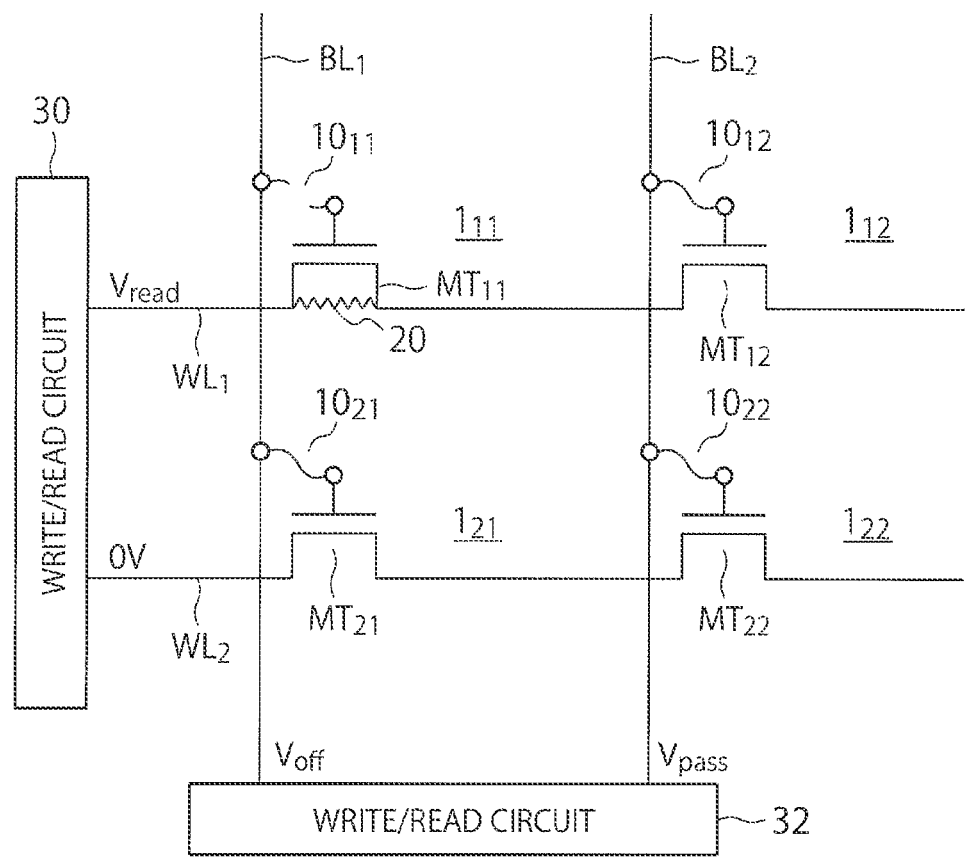
FIG. 9 is an explanatory diagram illustrating a read operation of the nonvolatile memory according to the first modification of the first embodiment.

A read operation of the nonvolatile memory according to the first modification will be described with reference to FIG. 9. FIG. 9 shows that the memory cell $1_{11}$ is programmed, the gate insulating film of the memory transistor $MT_{11}$ is broken down, and the fuse element $10_{11}$ is blown out. A conductive path 20 is formed between the source and the drain of the memory transistor $MT_{11}$ via the gate insulating film and the gate electrode.

An operation for reading data from the memory cell $1_{11}$ is performed in the following manner. The write/read circuit 32 applies a voltage Voff for turning OFF the memory transistor $MT_{21}$ to the bit line $BL_1$, and a voltage Vpass for turning ON the memory transistors $MT_{12}$, $MT_{22}$ to the bit line $BL_2$. As a result, the memory transistors $MT_{12}$, $MT_{22}$ are turned ON, and the memory transistor $MT_{21}$ is turned OFF. The write/read circuit then applies a read voltage Vread to the word line $WL_1$ and 0 V to the word line $WL_2$. Since a conductive path is formed between the source and the drain of the programmed memory transistor $MT_{11}$ via the gate insulating film and the gate electrode, the resistance between the source region and the drain region thereof is low. The data on whether the memory transistor $MT_{11}$ is programmed or not, i.e., the data stored in the memory transistor $MT_{11}$, can be read by detecting the current flowing through the word line $WL_1$. The gate insulating films of the unprogrammed memory transistors are not broken down. Therefore, the resistance between the source and the drain of each unprogrammed memory transistor is high. Therefore, if the memory transistor $MT_{11}$ is programmed as shown in FIG. 9, the current flowing through the word line $WL_1$ becomes higher than that when the memory transistor $MT_{11}$ is not programmed.

As described above, whether a memory cell connected to a word line is programmed can be determined by applying a read voltage Vread to the word line, and detecting the current flowing through the word line. A plurality of circuit information items can be dynamically switched by using the nonvolatile memory according to the first modification and correlating the data written to the memory cell to information on connection of a plurality of wiring lines.

(Second Modification)

Figure 11:
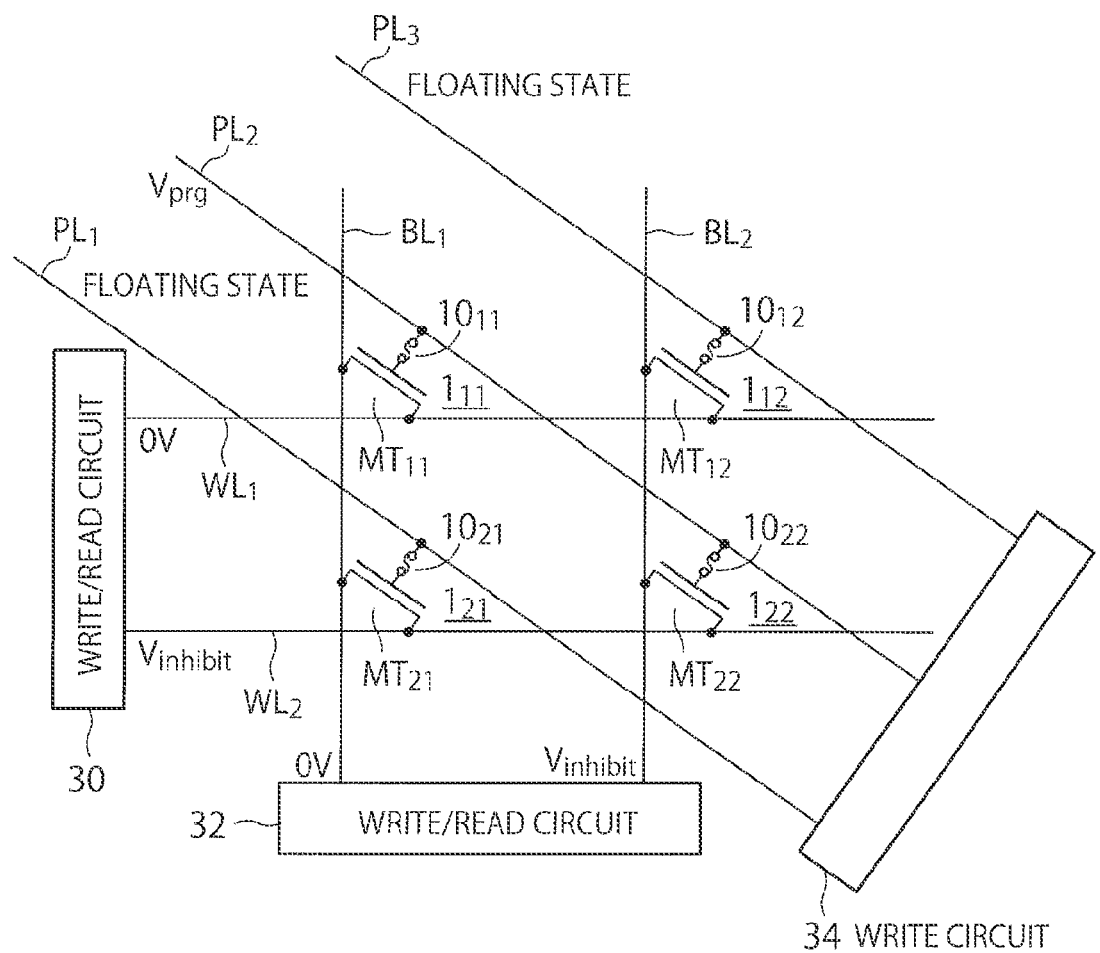
FIG. 11 is an explanatory diagram illustrating a write operation of the nonvolatile memory according to the second modification of the first embodiment.
Figure 12:
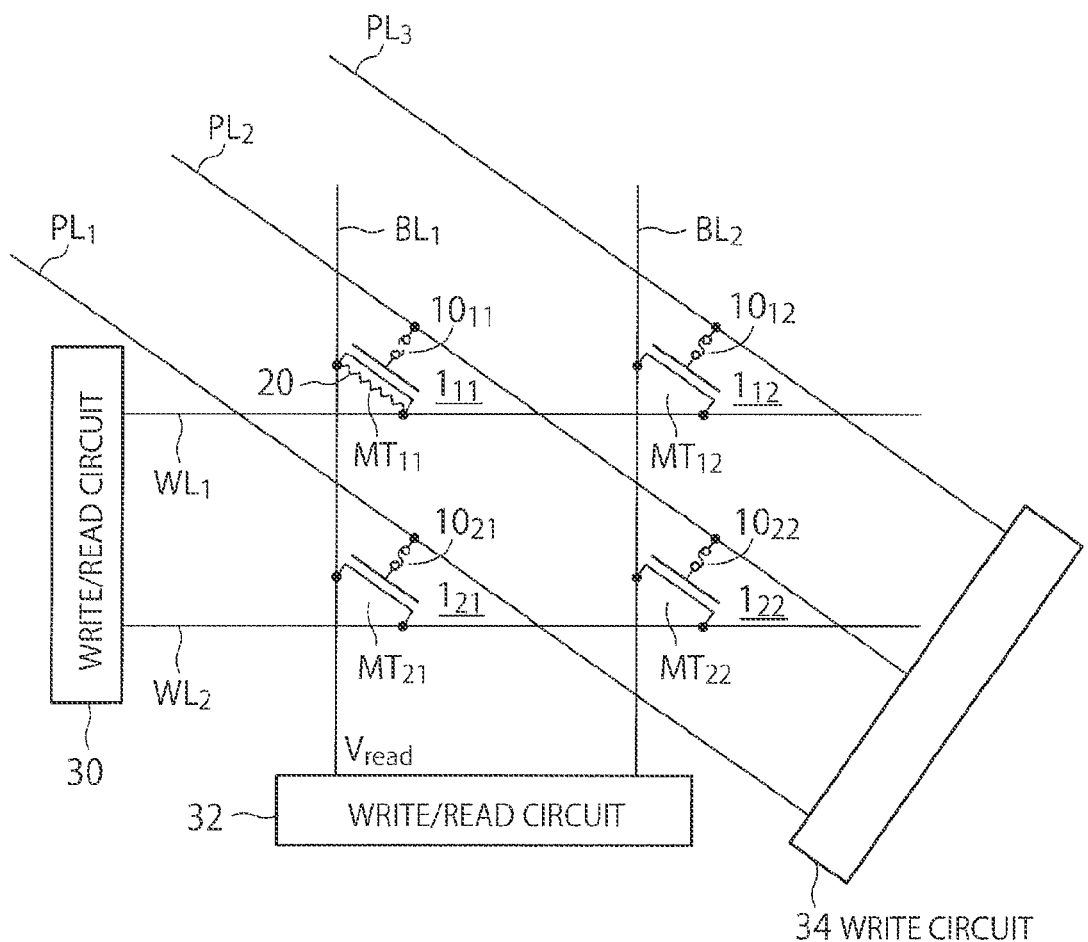
FIG. 12 is an explanatory diagram illustrating a read operation of the nonvolatile memory according to the second modification of the first embodiment.

A nonvolatile memory according to a second modification of the first embodiment will be described with reference to FIGS. 10 to 12. The nonvolatile memory according to the second modification includes memory cells $1_{11}$-$1_{22}$ arranged in a matrix form with rows and columns, a write/read circuit 30, a write/read circuit 32, a write circuit 34, bit lines $BL_1$, $BL_2$, and word lines $WL_1$, $WL_2$. Each memory cell $1_{ij}$ (i, j=1, 2) has the same configuration as the memory cell 1 shown in FIG. 1, and includes a memory transistor $MT_{ij}$ and a fuse element $10_{ij}$. One of the source and the drain of the memory transistor $MT_{ij}$ (i, j=1, 2) is connected to the bit line $BL_j$, and the other is connected to the word line $WL_i$. The gate electrode of the memory transistor $MT_{21}$ is connected to a program line $PL_1$ via the fuse element $10_{21}$. The gate electrodes of the memory transistors $MT_{11}$ and $MT_{22}$ are connected to a program line $PL_2$ via the fuse element $10_{11}$ and the fuse element $10_{22}$, respectively. The gate electrode of the memory transistor $MT_{12}$ is connected to a program line $PL_3$ via the fuse element $10_{12}$. Thus, the gate electrodes of the memory transistors included in diagonally arranged memory cells are connected to the same program line via the corresponding fuse elements.

The word lines $WL_1$, $WL_2$ are driven by the write/read circuit 30. The bit lines $BL_1$, $BL_2$ are driven by the write/read circuit 32. The program lines $PL_1$, $PL_2$, $PL_3$ are driven by the write circuit 34.

(Write Operation)

A write operation of the nonvolatile memory according to the second modification will be described with reference to FIG. 11, which shows voltage conditions when the memory cell $1_{11}$ is to be programmed. The write/read circuit 30 applies 0 V to the word line $WL_1$, and a write inhibiting voltage Vinhibit to the word line $WL_2$, and the write/read circuit 32 applies 0 V to the bit line $BL_1$, and the write Inhibiting voltage Vinhibit to the bit line $BL_2$. This applies a voltage of 0 V to the source and the drain of the memory transistor $MT_{11}$ included in the memory cell $1_{11}$ to be programmed. The voltage of 0 V is applied to one of the source and drain of the memory transistor $MT_{12}$, which is connected to the word line $WL_1$, and the write inhibiting voltage Vinhibit is applied to the other connected to the bit line $BL_2$. The write inhibiting voltage Vinhibit is also applied to the source and the drain of the memory transistor $MT_{22}$.

Then, a program voltage Vprg is applied to the program line PL2, to which the gate electrode of the memory transistor $MT_{11}$ included in the memory cell $1_{11}$ to be programmed is connected via the fuse element $10_{11}$. The other program lines PL1, PL3 are brought into a floating state. As a result, the program voltage Vprg is applied between the gate electrode and the source, and the gate electrode and the drain of the memory transistor $MT_{11}$. This breaks down the gate insulating film of the memory transistor $MT_{11}$, and forms a conductive path connecting the source and the drain via the gate insulating film and the gate electrode in the memory transistor $MT_{11}$. If the program voltage Vprg is kept being applied to the program line PL2, a current flows from the program line $PL_2$ to the source and the drain of the memory transistor $MT_{11}$ through the fuse element $10_{11}$, the gate electrode and the gate Insulating film of the memory transistor $MT_{11}$. The current blows out the fuse element $10_{11}$ to electrically disconnect the program line PL2 and the gate electrode of the memory transistor $MT_{11}$, thereby writing data to the memory cell $1_{11}$. Thereafter, the memory transistor $MT_{11}$ becomes a two-terminal element in which the source and the drain are electrically connected to each other via the gate insulating film and the gate electrode.

The program voltage Vprg applied to the program line $PL_2$ does not program the memory cell $1_{22}$ since the write inhibiting voltage Vinhibit is applied to the source and the drain of the memory transistor $MT_{22}$ connected to the program line $PL_2$ via the fuse element $10_{22}$. The memory transistors $MT_{12}$, $MT_{21}$ are not programmed either since the program lines $PL_3$, $PL_1$, to which the gate electrodes of the memory transistors $MT_{12}$, $MT_{21}$ are connected via the fuse elements $10_{12}$, $10_{21}$, are in a floating state.

(Read Operation)

A read operation of the nonvolatile memory according to the second modification will be described with reference to FIG. 12, which shows voltage conditions for reading data from the programmed memory cell $1_{11}$. As the memory cell $1_{11}$ in FIG. 12 is programmed, the fuse element $10_{11}$ is blown out, and a conductive path 20 is formed between the source and the drain via the gate insulating film and the gate electrode of the memory transistor $MT_{11}$. In a read operation, the write/read circuit 32 applies a read voltage Vread to the bit line $BL_1$. The bit line $BL_2$, the word lines $WL_1$, $WL_2$, and the program lines $PL_1$, $PL_2$, $PL_3$ are in a floating state. Since the conductive path is formed between the source and the drain of the memory transistor $MT_{11}$, a current flows from the bit line $BL_1$ to the word line $WL_1$ through the memory transistor $MT_{11}$. The data stored in the memory cell $1_{11}$ can be read by detecting the current by the write/read circuit 30. If the memory cell $1_{11}$ is not programmed when the aforementioned read operation is performed thereon, no current flows through the word line $WL_1$ since no conductive path is present between the source and the drain of the memory transistor $MT_{11}$. The data in the memory cells can be read in this manner.

According to the second modification, a plurality of circuit information items can be dynamically switched by correlating the data written to the memory cell to information on connection of a plurality of wiring lines, as in the case of the first modification.

Second Embodiment

Figure 13:
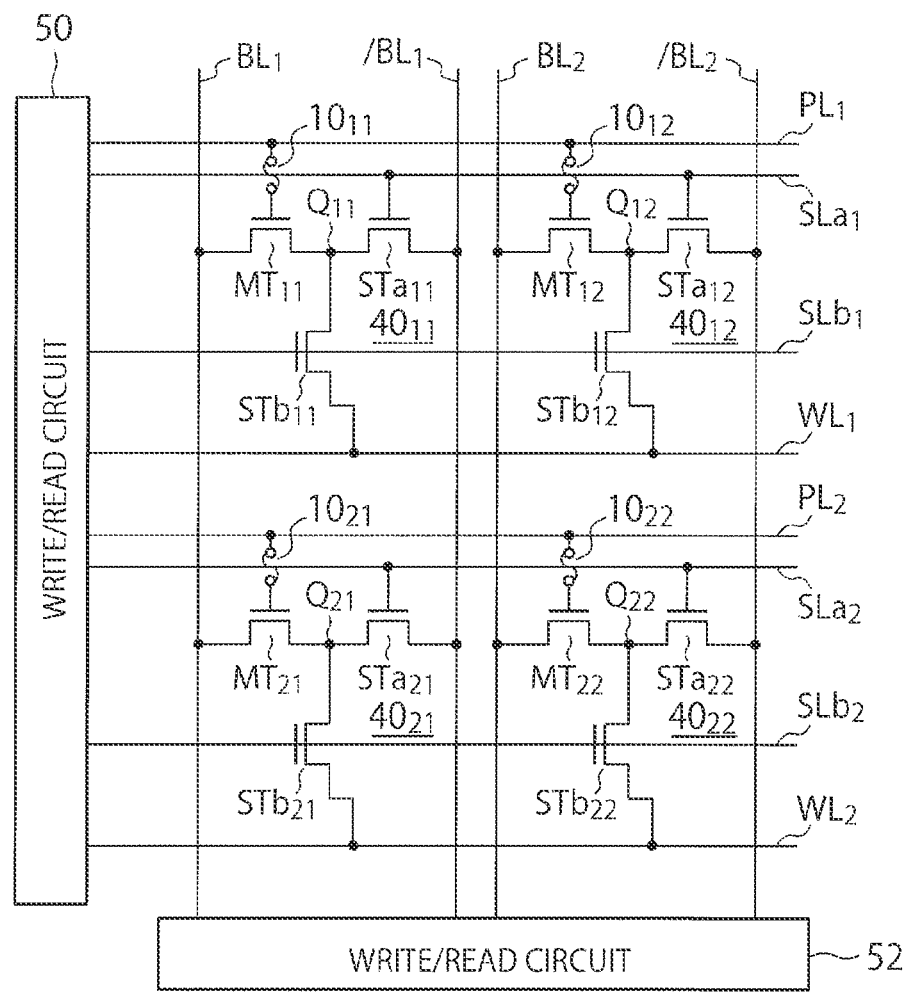
FIG. 13 is a circuit diagram showing a nonvolatile memory of a nonvolatile programmable logic switch according to a second embodiment.
Figure 14:
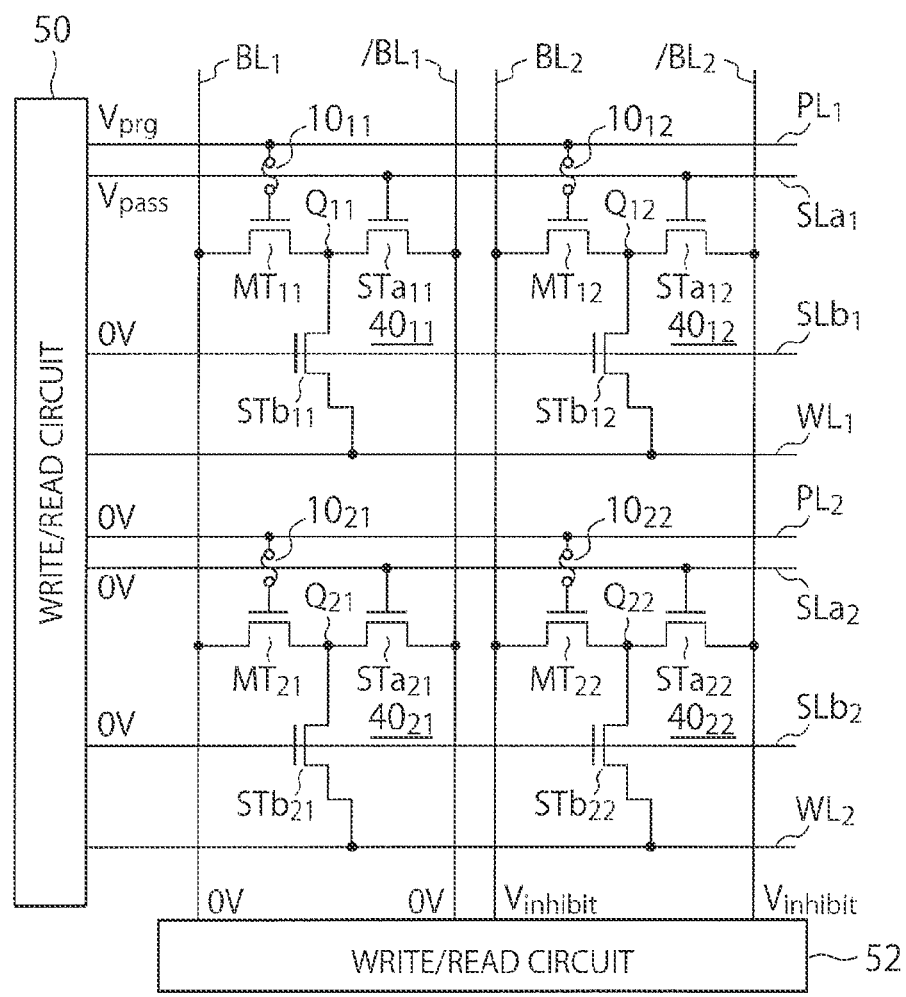
FIG. 14 is an explanatory diagram illustrating a write operation of the nonvolatile memory of the nonvolatile programmable logic switch according to the second embodiment.
Figure 15:
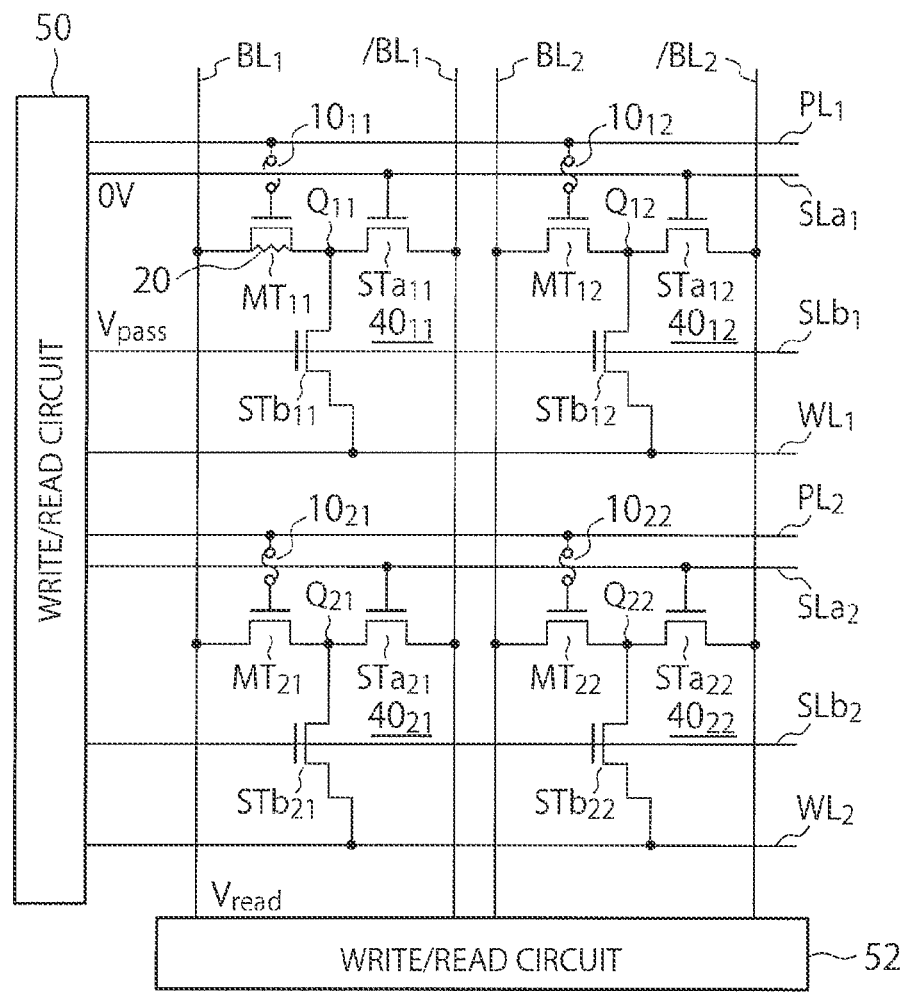
FIG. 15 is an explanatory diagram illustrating a read operation of the nonvolatile memory of the nonvolatile programmable logic switch according to the second embodiment.

A nonvolatile programmable logic switch according to a second embodiment will be described with reference to FIGS. 13 to 15.

The nonvolatile programmable logic switch ("logic switch") according to the second embodiment includes a nonvolatile memory. FIG. 13 shows a circuit diagram of this nonvolatile memory. The nonvolatile memory includes memory cells $40_{11}$-$40_{22}$ arranged in a matrix form with rows and columns, a plurality of bit lines $BL_1$, $/BL_1$, $BL_2$, $/BL_2$, a plurality of selection lines $SLa_1$, $SLb_1$, $SLa_2$, $SLb_2$, a plurality of program lines $PL_1$, $PL_2$, a plurality of word lines $WL_1$, $WL_2$, and write/read circuits 50, 52.

Each memory cell $40_{ij}$ (i, j=1, 2) includes a memory transistor $MT_{ij}$, selection transistors $STa_{ij}$, $STb_{ij}$, and a fuse element $10_{ij}$. One of the source and the drain of each memory transistor $MT_{ij}$ (i, j=1, 2) is connected to the bit line $BL_i$, and the other is connected to a node $Q_{ij}$. The gate electrode of each memory transistor $MT_{ij}$ (i, j=1, 2) is connected to the program line $PL_i$ via the fuse element $10_{ij}$.

One of the source and the drain of the selection transistor $STa_{ij}$ (i, j=1, 2) is connected to the node $Q_{ij}$, the other is connected to the bit line $/BL_j$, and the gate is connected to the selection line $SLa_i$. One of the source and the drain of the selection transistor $STb_{ij}$ (i, j=1, 2) Is connected to the node $Q_{ij}$, the other is connected to the word line $WL_i$, and the gate is connected to the selection line $SLb_i$.

The selection lines $SLa_1$, $SLb_1$, $SLa_2$, $SLb_2$, the program lines $PL_1$, $PL_2$, and the word lines $WL_1$, $WL_2$ are driven by the write/read circuit 50. The bit lines $BL_1$, $/BL_1$, $BL_2$, $/BL_2$ are driven by the write/read circuit 52.

(Write Operation)

An operation for writing data to a selected memory cell in the logic switch according to the second embodiment will be described with reference to FIG. 14. FIG. 14 is a circuit diagram showing voltage conditions for selecting and writing data to the memory cell $40_{11}$.

First, the write/read circuit 52 applies 0 V to the bit lines $BL_1$, $/BL_1$, and a write inhibiting voltage Vinhibit to the bit lines $BL_2$, $/BL_2$. The write/read circuit 50 applies a voltage Vpass for turning ON the selection transistors $STa_{11}$, $STa_{12}$ to the selection line $SLa_1$, and 0 V to the selection lines $SLb_1$, $SLa_2$, $SLb_2$ and the program line $PL_2$. This turns ON the selection transistors $STa_{11}$, $STa_{12}$ to set the potential of the node $Q_{11}$ and the potential of the node $Q_{12}$ to be 0 V and Vinhibit, respectively. Subsequently, the write/read circuit 50 applies a program voltage Vprg to the program line PL1. The word lines $WL_1$, $WL_2$ are in a floating state.

The program voltage Vprg applied to the program line $PL_1$ is also applied between the program line $PL_1$ and the source and the drain of the memory transistor $MT_{11}$. This breaks down the gate Insulating film of the memory transistor $MT_{11}$ to electrically connect the source and the drain thereof via the gate insulating film and the gate electrode. As a result, a current flows from the program line $PL_1$ to the source and the drain of the memory transistor $MT_{11}$ via the fuse element $10_{11}$, the gate electrode, and the gate insulating film thereof. If the program voltage Vprg is kept being applied to the program line $PL_1$, the current blows out the fuse element $10_{11}$, and the memory transistor $MT_{11}$ becomes a two-terminal element in which the source and the drain are electrically connected to each other via the gate insulating film and the gate electrode. This allows the memory cell $40_{11}$ to be programmed.

The memory cell $40_{12}$ is not programmed since the write inhibiting voltage Vinhibit applied to the source and the drain of the memory transistor $MT_{12}$ prevents the gate insulating film of the memory transistor $MT_{12}$ from being broken down by the program voltage Vprg applied to the program line $PL_1$.

(Read Operation)

A read operation of the logic switch according to the second embodiment will be described with reference to FIG. 15, which is a circuit diagram showing voltage conditions in a case where a programmed memory transistor $MT_{11}$ of the memory cell $40_{11}$ is selected and read. As shown in FIG. 15, the fuse element $10_{11}$ is blown out, and a conductive path 20 is formed between the source and the drain of the memory transistor $MT_{11}$ via the gate insulating film and the gate electrode.

The write/read circuit 50 applies 0 V to the selection line $SLa_1$ to turn OFF the selection transistors $STa_{11}$, $STa_{12}$, and a voltage Vpass to the selection line $SLb_1$ to turn ON the selection transistors $STb_{11}$, $STb_{12}$. The write/read circuit 52 then applies a read voltage Vread to the bit line $BL_1$. This causes a current to flow from the bit line $BL_i$ to the word line $WL_1$ via the memory transistors $MT_{11}$, the node $Q_{11}$, and the selection transistor $STb_{11}$.

If the memory cell $40_{11}$ is not programmed, the source and the drain of the memory transistor $MT_{11}$ are not electrically connected to each other. As a result, no current flows through the word line $WL_1$ in the above read operation.

Data can be read from the memory cells in this manner.

As described above, the logic switch according to the second embodiment is capable of switching a plurality of circuit information items dynamically.

Third Embodiment

Figure 16:
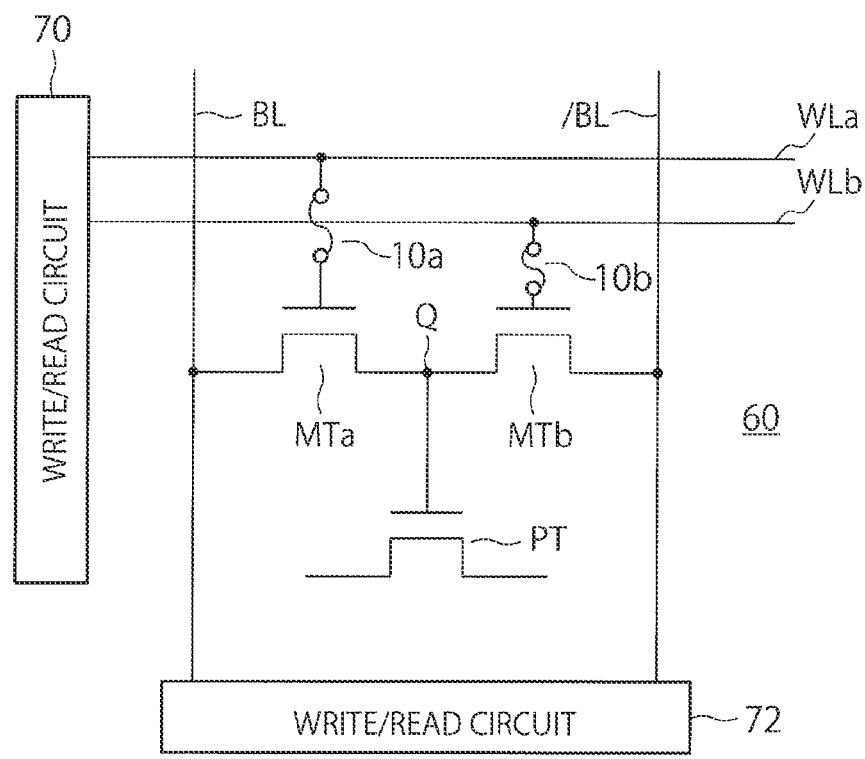
FIG. 16 is a circuit diagram showing a nonvolatile programmable logic switch according to a third embodiment.

A nonvolatile programmable logic switch ("logic switch") according to a third embodiment will be described with reference to FIG. 16. FIG. 16 is a diagram showing the logic switch according to the third embodiment. The logic switch includes a memory cell 60, bit lines BL, /BL, word lines WLa, WLb, a write/read circuit 70, and a write/read circuit 72. The memory cell 60 includes two memory transistors MTa, MTb connected in series, fuse elements 10a, 10b, and a pass transistor PT.

One of the source and the drain of the memory transistor MTa is connected to the bit line BL, the other is connected to a node Q, and the gate is connected to the word line WLa via the fuse element 10a. One of the source and the drain of the memory transistor MTb is connected to the bit line /BL, the other is connected to the node Q, and the gate is connected to the word line WLb via the fuse element 10b. The gate of the pass transistor PT is connected to the node Q.

The write/read circuit 70 drives the word lines WLa, WLb. The write/read circuit 72 drives the bit lines BL, /BL.

In this memory cell, at most one of the two memory transistors MTa, MTb is programmed. First, the write/read circuit 72 applies 0 V to the bit lines BL, /BL. The write/read circuit 70 then applies a program voltage Vprg to the gate of a memory transistor to be programmed, for example the memory transistor MTa, through the word line $WL_a$ to which the gate is connected via the fuse element 10a, and applies a voltage Vpass to the word line $WL_b$. This turns ON the memory transistor MTb, and sets the potential of the node Q to be 0 V. Furthermore, a program voltage Vprg is applied between the word line $WL_a$ and the source and the drain of the memory transistor MTa to cause a breakdown of the gate insulating film of the memory transistor MTa. As a result, the source and the drain of the memory transistor MTa are electrically connected to each other via the gate insulating film and the gate electrode. If the program voltage Vprg is kept being applied to the word line WLa, a current flows from the word line WLa to the source and the drain of the memory transistor MTa via the fuse element 10a, the gate electrode, and the gate insulating film. The current blows out the fuse element 10a, and the operation to write data to the memory cell ends.

A read operation is performed in the following manner. It is assumed that the read operation is performed on the memory transistor MTa. First, the write/read circuit 72 applies a read voltage Vread to the bit line BL to which one of the source and the drain of the memory transistor MTa to be read is connected, and 0 V to the bit line /BL to which the memory transistor MTb that is not read is connected. The write/read circuit 70 applies a voltage Vpass to the word line WLb to which the memory transistor MTb that is not read is connected.

If the memory transistor MTa has been programmed, the memory transistor MTb is turned ON since no data has been written thereto. Furthermore, a current flows from the bit line BL to the bit line /BL via the memory transistors MTa, MTb since the source and the drain of the memory transistor MTa are electrically connected to each other via the gate insulating film and the gate electrode. The potential of the node Q in this state is determined by the division ratio that is a function of the conduction resistance of the memory transistor MTa and ON resistance of the memory transistor MTb. The sizes of the memory transistors MTa, MTb and the pass transistor PT are adjusted so that the pass transistor PT is turned ON by the aforementioned potential of the node Q.

If the memory transistor MTa has not been programmed, the source and the drain thereof are not electrically connected to each other. Accordingly, the memory transistor MTa is in the OFF state. If the memory transistor MTb has been programmed in this state, the pass transistor PT is in the OFF state since the source and the drain of the memory transistor MTb are electrically conducted to each other, and the potential of the node Q becomes substantially the same as the potential of the bit line /BL. If the memory transistor MTb has not been programmed either, the memory transistor MTb is in the OFF state since the voltage Vpass is applied to the word line WLb. The potential of the node Q at this time is substantially the same as the potential of the bit line /BL, and thus the pass transistor PT is in the OFF state.

As described above, the pass transistor PT may be controlled to be turned ON or OFF based on data stored in the memory transistors MTa, MTb of the memory cell.

(First Modification)

Figure 17:
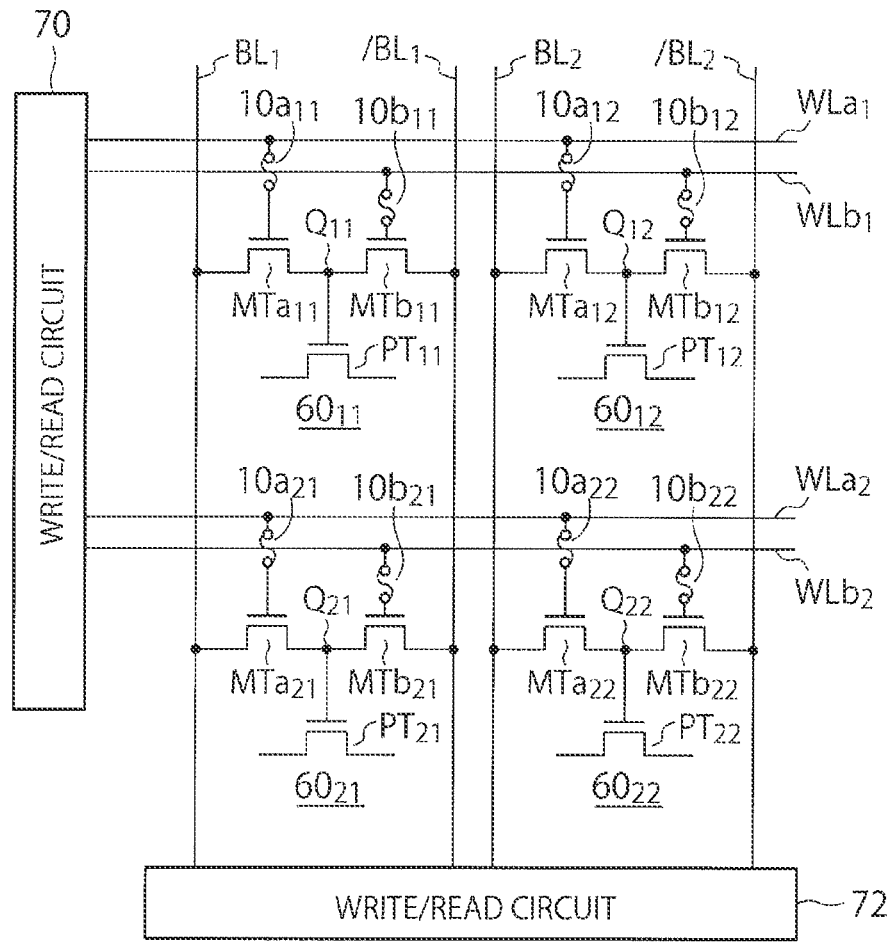
FIG. 17 is a circuit diagram showing a nonvolatile programmable logic switch according to a first modification of the third embodiment.

FIG. 17 shows a logic switch according to a first modification of the third embodiment. The logic switch according to the first modification includes memory cells $60_{11}$-$60_{22}$ arranged in a matrix form with rows and columns, a write/read circuit 70, a write/read circuit 72, a plurality of bit lines $BL_1$, $/BL_1$, $BL_2$, $/BL_2$, and a plurality of word lines $WLa_1$, $WLb_1$, $WLa_2$, $WLb_2$.

Each memory cell $60_{ij}$ (i, j=1, 2) Includes two memory transistors $MTa_{ij}$, $MTb_{ij}$ connected in series, fuse elements $10a_{ij}$, $10b_{ij}$, and a pass transistor $PT_{ij}$. One of the source and the drain of each memory transistor $MTa_{ij}$ (i, j=1, 2) is connected to the bit line $BL_j$, the other is connected to the node $Q_{ij}$, and the gate electrode is connected to the word line $WLa_i$ via the fuse element $10a_{ij}$. One of the source and the drain of each memory transistor $MTb_{ij}$ (i, j=1, 2) is connected to the bit line $/BL_j$, the other is connected to the node $Q_{ij}$, and the gate electrode is connected to the word line $WLb_i$ via the fuse element $10b_{ij}$. The gate of each pass transistor $PT_{ij}$ (i, j=1, 2) Is connected to the node Q.

The write/read circuit 70 drives the word lines $WLa_1$, $WLb_1$, $WLa_2$, $WLb_2$. The write/read circuit 72 drives the bit lines $BL_1$, $/BL_1$, $BL_2$, $/BL_2$.

(Write Operation)

Figure 18:
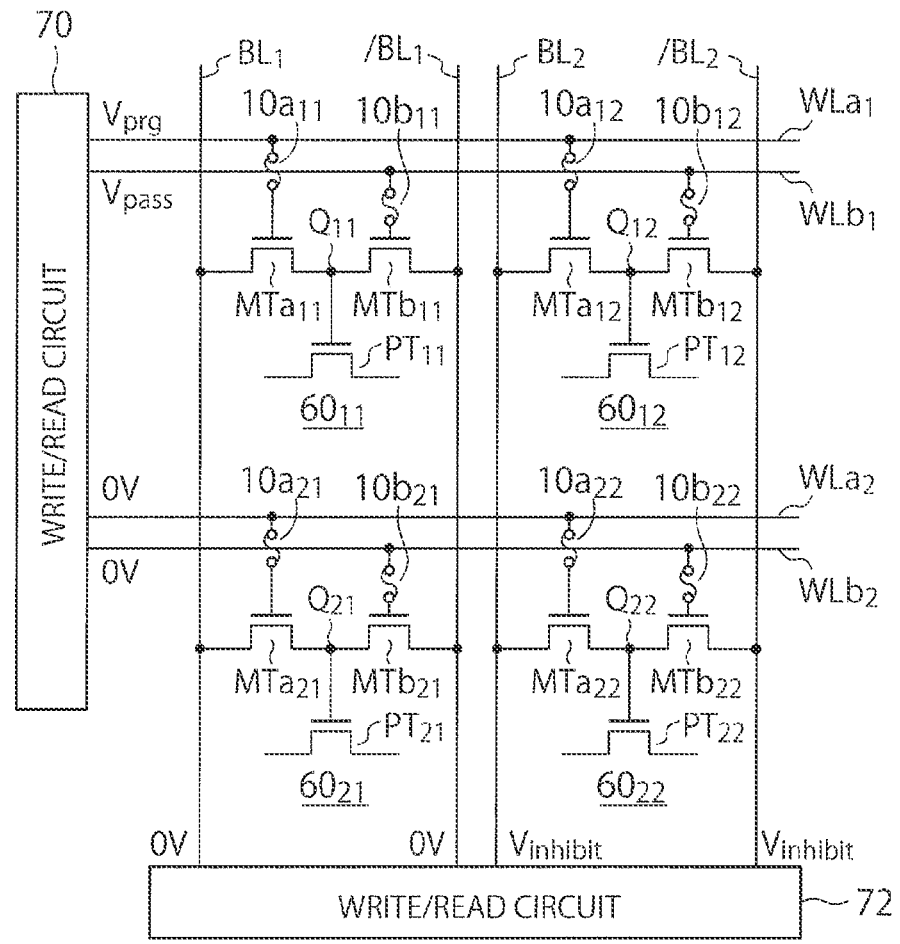
FIG. 18 is an explanatory diagram illustrating a write operation of the nonvolatile programmable logic switch according to the first modification of the third embodiment.

A write operation of the logic switch according to the first modification will be described with reference to FIG. 18. FIG. 18 shows voltage conditions for selecting the memory cell $60_1$, and writing data to the memory transistor $MTa_{11}$ in the logic switch according to the first modification. First, the write/read circuit 72 applies 0 V to the bit lines $BL_1$, $/BL_1$, and a write inhibiting voltage Vinhibit to the bit lines $BL_2$, $/BL_2$. The write/read circuit 70 applies 0 V to the word lines $WLa_2$, $WLb_2$, a program voltage Vprg to the word line $WLa_1$, and a voltage Vpass to the word line $WLb_1$.

The voltage Vpass applied to the word line $WLb_1$ turns ON the memory transistor $MTb_{11}$ that is not to be programmed. This applies 0 V to the source and the drain of the memory transistor $MTa_{11}$ to be programmed. Since the voltage Vprg is applied to the word line $WLa_1$, the program voltage Vprg is applied between the word line $WLa_1$ and the source and the drain of the memory transistor $MTa_{11}$ to cause a breakdown of the gate Insulating film of the memory transistor $MTa_{11}$, thereby electrically connecting the source and the drain via the gate insulating film and the gate electrode thereof. If the program voltage Vprg is kept being applied to the word line $WLa_1$, a current flows between the word line $WLa_1$ and the source and the drain of the memory transistor $MTa_{11}$. This current blows out the fuse element $10a_{11}$. As a result, the gate electrode of the memory transistor $MTa_{11}$ is disconnected from the word line $WLa_1$, and the memory transistor $MTa_{11}$ of the memory cell $60_{11}$ is programmed. The memory transistors $MTa_{12}$, $MTb_{12}$ of the memory cell $60_{12}$ are not programmed at this time since the write inhibiting voltage Vinhibit is applied to the bit lines $BL_2$, $/BL_2$ to which the memory transistors $MTa_{12}$, $MTb_{12}$ are connected.

(Read Operation)

Figure 19:
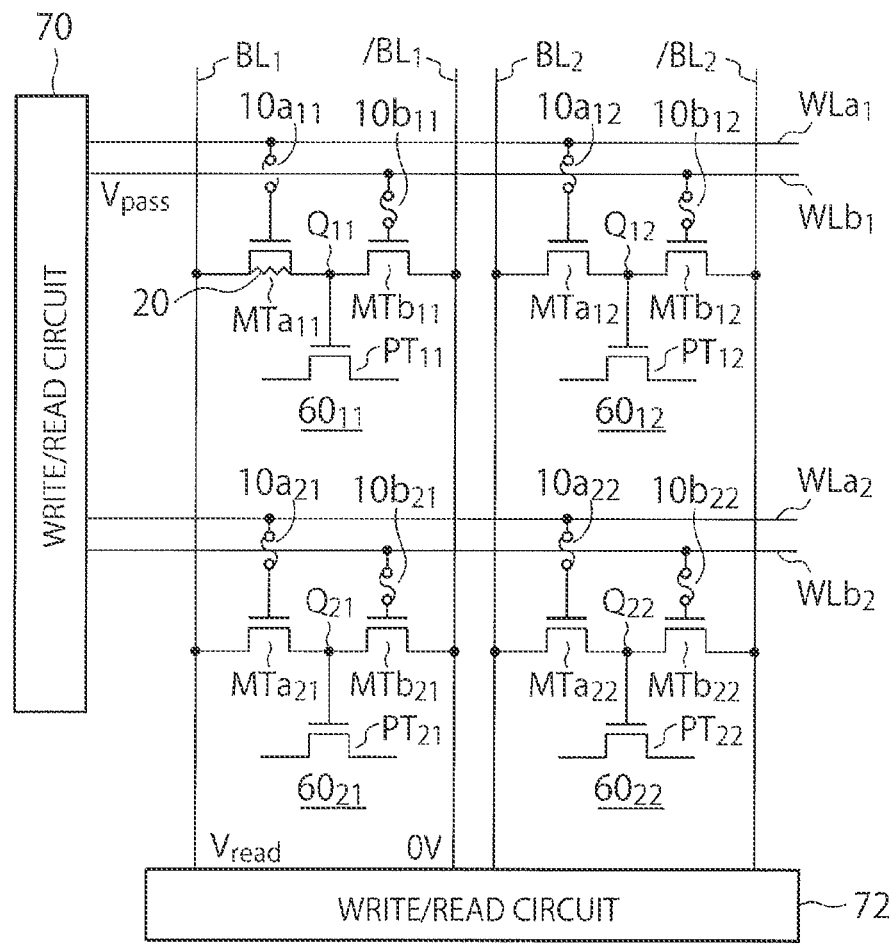
FIG. 19 is and explanatory diagram illustrating a read operation of the nonvolatile programmable logic switch according to the first modification of the third embodiment.

A read operation of the logic switch according to the first modification will be described with reference to FIG. 19. FIG. 19 shows voltage conditions for selecting the memory cell $60_{11}$ to read data from the memory transistor $MTa_{11}$ in the logic switch according to the first modification. The fuse element $10a_{11}$ is blown out, and a conductive path 20 is formed between the source and the drain via the gate insulating film and the gate electrode of the memory transistor $MTa_{11}$ in FIG. 19.

First, the write/read circuit 70 applies a voltage Vpass to the word line WLb to turn ON the memory transistor MTb. The write/read circuit 72 then applies a read voltage Vread to the bit line $BL_1$, and 0 V to the bit line $/BL_1$. As a result, data can be read from the memory cell $60_1$, in the same manner as the read operation in the third embodiment described with reference to FIG. 16. The ON state and the OFF state of the pass transistor $PT_{11}$ at this time is controlled based on the data stored in the memory transistor $MTa_{11}$.

As described above, the third embodiment and its modification are capable of switching a plurality of circuit information items dynamically.

Fourth Embodiment

Figure 20:
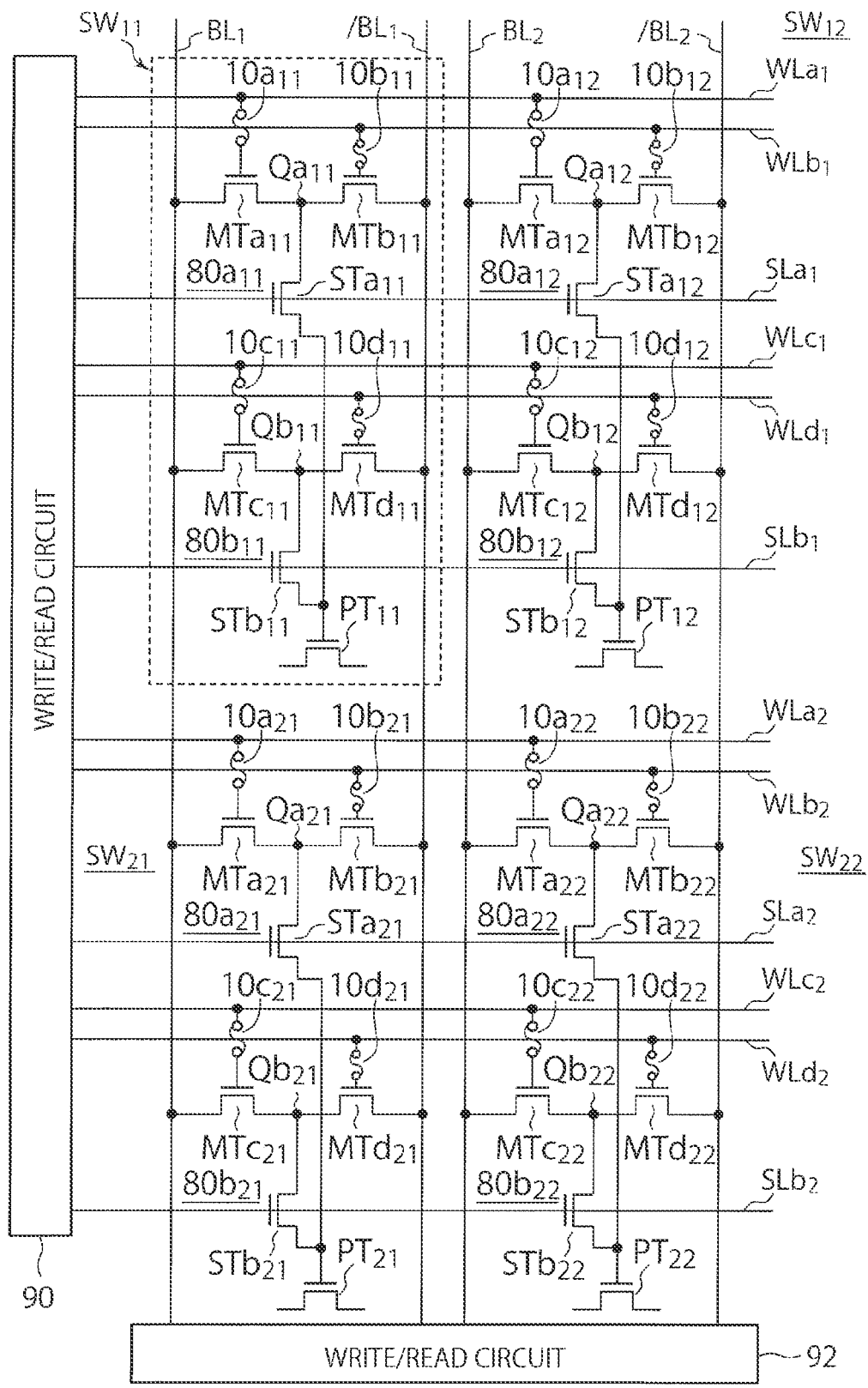
FIG. 20 is a circuit diagram showing a nonvolatile programmable logic switch according to a fourth embodiment.

A nonvolatile programmable logic switch ("logic switch") according to a fourth embodiment will be described with reference to FIG. 20.

The logic switch according to the fourth embodiment includes switch cells $SW_{11}$-$SW_{22}$ arranged in a matrix form with rows and columns, a write/read circuit 90, a write/read circuit 92, a plurality of bit lines $BL_1$, $/BL_1$, $BL_2$, $/BL_2$, a plurality of word lines $WLa_1$, $WLb_1$, $WLc_1$, $WLd_1$, $WLa_2$, $WLb_2$, $WLc_2$, $WLd_2$, and a plurality of selection lines $SLa_1$, $SLb_1$, $SLa_2$, $SLb_2$.

Each switch cell $SW_{ij}$ (i, j=1, 2) includes a first memory cell $80a_{ij}$, a second memory cell $80b_{ij}$, fuse elements $10a_{ij}$, $10b_{ij}$, $10c_{ij}$, $10d_{ij}$, and a pass transistor $PT_{ij}$.

The first memory cell $80a_{ij}$ (i, j=1, 2) stores first context switching information, and includes memory transistors $MTa_{ij}$, $MTb_{ij}$ and a selection transistor $STa_{ij}$. One of the source and the drain of the memory transistor $MTa_{ij}$ (i, j=1, 2) is connected to the bit line $BL_j$, the other is connected to a node $Qa_{ij}$, and the gate electrode is connected to the word line $WLa_i$ via the fuse element $10a_{ij}$. One of the source and the drain of the memory transistor $MTb_{ij}$ (i, j=1, 2) is connected to the bit line $/BL_j$, the other is connected to the node $Qa_{ij}$, and the gate electrode is connected to the word line $WLb_i$ via the fuse element $10b_{ij}$. One of the source and the drain of the selection transistor $STa_{ij}$ (i, j=1, 2) is connected to the node $Qa_{ij}$, the other is connected to the gate of the pass transistor $PT_{ij}$, and the gate is connected to the selection line $SLa_i$.

The second memory cell $80b_{ij}$ (i, j=1, 2) stores second context switching information, and includes memory transistors $MTc_{ij}$, $MTd_{ij}$ and a selection transistor $STb_{ij}$. One of the source and the drain of the memory transistor $MTc_{ij}$ (i, j=1, 2) is connected to the bit line $BL_j$, the other is connected to a node $Qb_{ij}$, and the gate electrode is connected to the word line $WLc_i$ via the fuse element $10c_{ij}$. One of the source and the drain of the memory transistor $MTd_{ij}$ (i, j=1, 2) is connected to the bit line $/BL_j$, the other is connected to the node $Qb_{ij}$, and the gate electrode is connected to the word line $WLd_i$ via the fuse element $10d_{ij}$. One of the source and the drain of the selection transistor $STb_{ij}$ (i, j=1, 2) is connected to the node $Qb_{ij}$, the other is connected to the gate of the pass transistor $PT_{ij}$, and the gate is connected to the selection line $SLb_i$.

The write/read circuit 90 drives the word lines $WLa_1$, $WLb_1$, $WLc_1$, $WLd_1$, $WLa_2$, $WLb_2$, $WLc_2$, $WLd_2$ and the selection lines $SLa_1$, $SLb_1$, $SLa_2$, $SLb_2$. The write/read circuit 92 drives the bit lines $BL_1$, $/BL_1$, $BL_2$, $/BL_2$.

(Write Operation)

Figure 21:
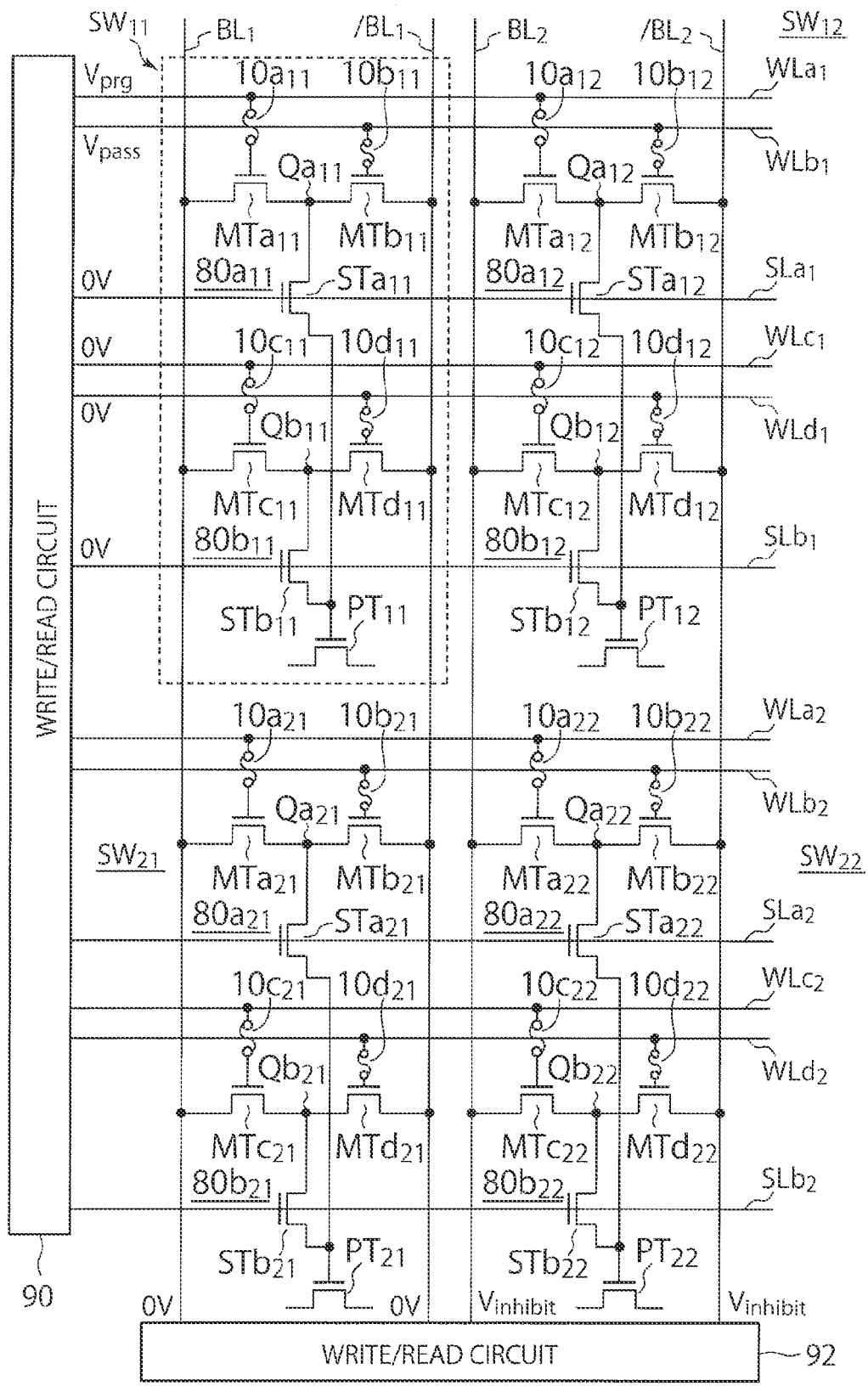
FIG. 21 is an explanatory diagram illustrating a write operation of the nonvolatile programmable logic switch according to the fourth embodiment.

A write operation of the logic switch according to the fourth embodiment will be described with reference to FIG. 21. FIG. 21 shows voltage conditions for selecting the switch cell $SW_{11}$ to write data to the memory transistor $MTa_{11}$ of the memory cell $80a_{11}$ included in the switch cell $SW_{11}$.

The write/read circuit 92 applies 0 V to the bit lines $BL_1$, $/BL_1$ to which the column of memory cells including the memory cell with the memory transistor $MTa_{11}$ is connected, and a write inhibiting voltage Vinhibit to the bit line $BL_2$, $/BL_2$ to which the other column of memory cells is connected.

The write/read circuit 90 applies 0 V to the word lines $WLc_1$, $WLd_1$ and the selection lines $SLa_1$, $SLb_1$ to turn OFF the memory transistors $MTc_{11}$, $MTd_{11}$ of the memory cell $80b_{11}$ and the selection transistors $STa_{11}$, $STb_{11}$.

Furthermore, the write/read circuit 90 applies a voltage Vpass to the word line $WLb_1$, and a program voltage Vprg to the word line $WLa_1$. The voltage Vpass applied to the word line $WLb_1$ turns ON the memory transistor $MTb_{11}$ and the memory transistor $MTb_{12}$. As a result, 0 V is applied to the source and the drain of the memory transistor $MTa_{11}$, and the write inhibiting voltage Vinhibit is applied to the source and the drain of the memory transistor $MTa_{12}$. Thus, the program voltage Vprg applied to the word line $WLa_1$ is also applied between the word line $WLa_1$ and the source and the drain of the memory transistor $MTa_{11}$ to cause a breakdown of the gate insulating film of the memory transistor $MTa_{11}$. This electrically connects the source and the drain of the memory transistor $MTa_{11}$ and forms a conductive path therebetween through the gate insulating film and the gate electrode. As a result, a current flows from the word line $WLa_1$ to the source and the drain of the memory transistor $MTa_{11}$ via the fuse element $10a_{11}$ and the gate electrode and the gate insulating film of the memory transistor $MTa_{11}$. If the program voltage Vprg is kept being applied to the word line $WLa_1$, the aforementioned current blows out the fuse element $10a_{11}$, and the programming of the memory transistor $MTa_{11}$ ends. The program voltage Vprg applied to the word line WLa1 does not program the memory transistor $MTa_{12}$ since the write inhibiting voltage Vinhibit is applied to the source and the drain of the memory transistor $MTa_{12}$.

As described above, data can be written to a memory cell of a selected switch cell. Like the third embodiment, at most one of the two memory transistors in one memory cell is programmed in the fourth embodiment.

(Read Operation)

Figure 22:
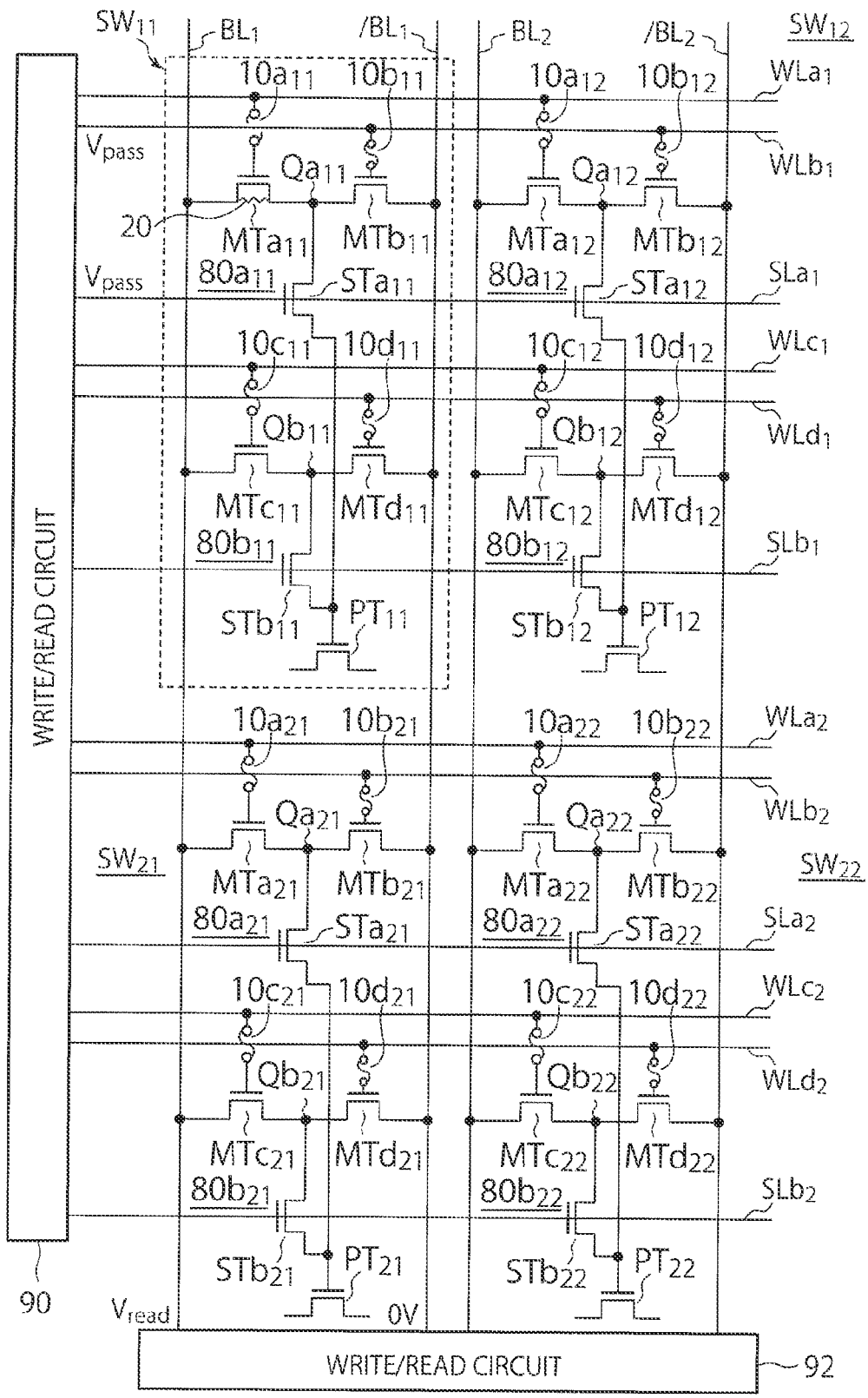
FIG. 22 is an explanatory diagram illustrating a read operation of the nonvolatile programmable logic switch according to the fourth embodiment.

A read operation of the logic switch according to the fourth embodiment will be described with reference to FIG. 22. FIG. 22 shows voltage conditions for selecting the switch cell $SW_{11}$, and reading data from the programmed memory transistor $MTa_{11}$ included in the switch cell $SW_{11}$. The fuse element $10a_{11}$ is blown out and a conductive path 20 is formed between the source and the drain via the gate insulating film and the gate electrode of the memory transistor $MTa_{11}$ in FIG. 22.

First, the write/read circuit 90 applies a voltage Vpass to the word line $WLb_1$ to turn ON the memory transistor $MTb_{11}$, and a voltage Vpass to the selection line $SLa_1$ to turn ON the selection transistor $STa_{11}$. The write/read circuit 92 applies a read voltage Vread to the bit line $BL_1$, and 0 V to the bit line $/BL_1$. This causes a current to flow from the bit line $BL_1$ to the bit line $/BL_1$ via the memory transistor $MTa_{11}$, the node $Qa_{11}$, and the memory transistor $MTb_{11}$. The potential of the node $Qa_{11}$ is determined by the division ratio that is a function of the conduction resistance of the memory transistor $MTa_{11}$ and the ON resistance of the memory transistor $MTb_{11}$. The sizes of the memory transistors $MTa_{11}$, $MTb_{11}$, the selection transistor $STa_{11}$, and the pass transistor $PT_{11}$ are adjusted so that the determined potential turns ON the pass transistor $PT_{11}$.

If the memory transistor $MTa_{11}$ has not been programmed, it is in the OFF state since the source and the drain thereof are not electrically connected to each other. If the memory transistor $MTb_{11}$ has been programmed, the pass transistor $PT_{11}$ is in the OFF state since the potential of the node $Qa_{11}$ is substantially equal to the potential of the bit line $/BL_1$ due to the electrical connection between the source and the drain of the memory transistor $MTb_{11}$. If the memory transistor $MTb_{11}$ has not been programmed, the memory transistor $MTb_{11}$ is in the ON state since the voltage Vpass is applied to the word line $WLb_1$. The potential of the node $Qa_{11}$ at this time is substantially equal to the potential of the bit line $/BL_1$ to turn OFF the pass transistor $PT_{11}$.

As described above, the fourth embodiment is capable of switching a plurality of circuit information items dynamically.

Fifth Embodiment

Figure 23:
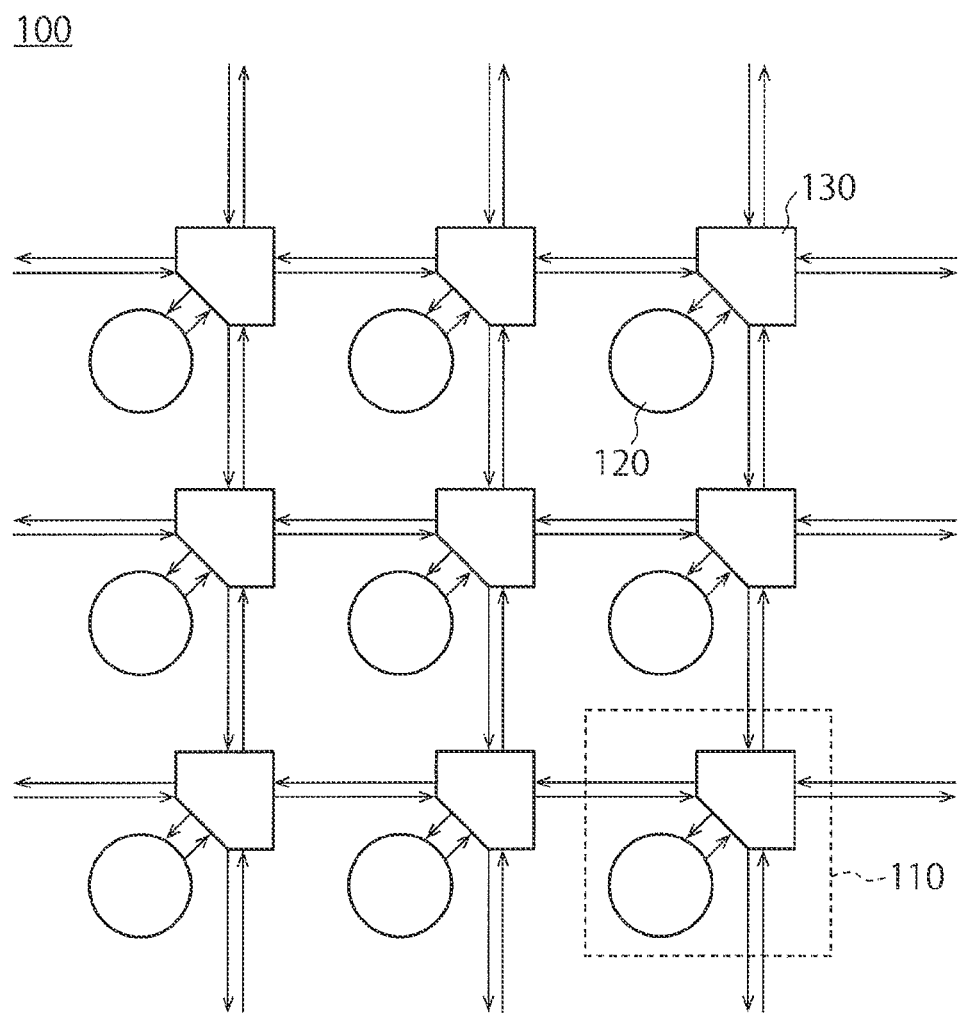
FIG. 23 is a diagram showing a nonvolatile programmable logic circuit according to a fifth embodiment.

FIG. 23 shows a nonvolatile programmable logic circuit according to a fifth embodiment. The nonvolatile programmable logic circuit 100 is an FPGA, and includes a plurality of basic blocks 110 arranged in an array form. Each basic block 110 is connected to adjacent basic blocks 110 with wiring lines, and includes a logic block 120 and a switch block 130. The logic block 120 performs logical operations basically using a look-up table containing a truth table.

Each switch block 130 controls the connection and the disconnection of the wiring lines connecting to adjacent basic blocks 110 so that signals are transmitted to given directions. Each switch block 130 also connects to the logic block 120 included in the relevant basic block 110 including the switch block 130. The logic block 120 and the switch block 130 are capable of controlling the connection based on data stored in a configuration memory of the programmable logic circuit.

Figure 10:
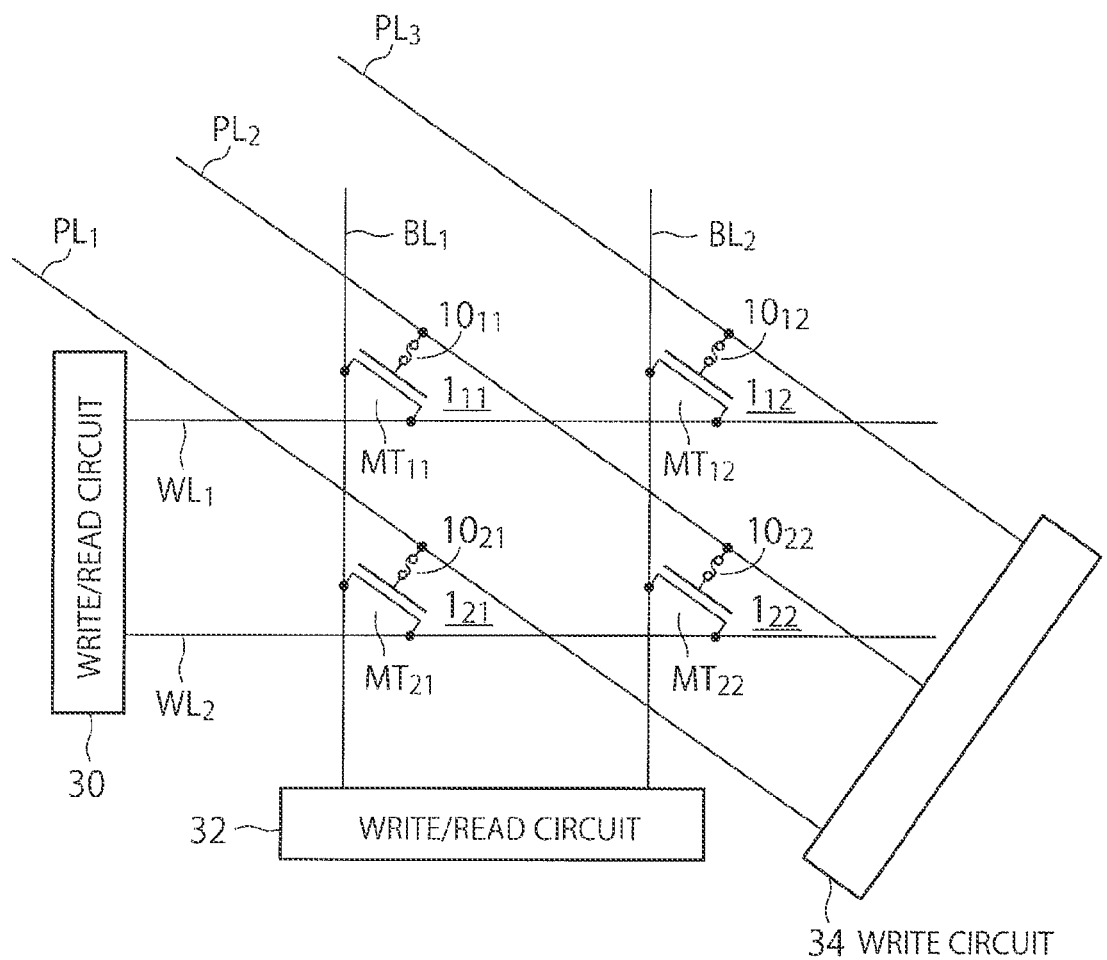
FIG. 10 is a circuit diagram showing a nonvolatile memory according to a second modification of the first embodiment.

The programmable logic circuit included in the nonvolatile programmable logic circuit according to the fifth embodiment includes, for example, the nonvolatile memory according to the second modification of the first embodiment shown in FIG. 10. Unlike the nonvolatile memory according to the second modification of the first embodiment, if one of the memory cell $1_{11}$, $1_{12}$, $1_{21}$, $1_{22}$ is programmed, the other memory cell connected to the same word line WL is not programmed in the nonvolatile memory according to the fifth embodiment. For example, if the memory cell $1_{11}$ shown in FIG. 10 is programmed, the memory cell $1_{12}$ connected to the same word line $WL_1$ cannot be programmed. This enables stable programming of one memory cell per each word line WL. If it is assumed that signals are inputted to a bit line BL and outputted from a word line WL in an FPGA, signals inputted to different bit lines BL are not outputted from a single word line WL. Because of this, the programmable logic circuit including the nonvolatile memory according to the second modification of the first embodiment can be used for FPGAs effectively.

A read operation is performed by selecting one memory cell by means of the write/read circuits 30, 32 shown in FIG. 10, applying a read voltage Vread to the bit line BL to which the selected memory cell is connected by means of the write/read circuit 30, and detecting whether a current flows through the word line to which the selected memory cell is connected by means of the write/read circuit 32. This configuration can be applied to switch blocks and logic blocks of FPGAs and used as a signal switching circuit through which logic signal can pass through only the programmed memory cell $10_{ij}$ by setting the read voltage Vread as a high level voltage Vdd of logic signals, and using the write/read circuit 30 as an input circuit and the write/read circuit 32 as an output circuit.

The write/read circuit 30 of the second modification shown in FIG. 10 may be configured such that one of a read unit and a write unit thereof is connected to one terminal of each of the word lines $WL_1$, $WL_2$, and the other is connected to the other terminal of each of the word lines $WL_1$, $WL_2$. The write/read circuit 32 of the second modification shown in FIG. 10 may be configured such that one of a read unit and a write unit thereof is connected to one terminal of each of the bit lines $BL_1$, $BL_2$, and the other is connected to the other terminal of each of the bit lines $BL_1$, $BL_2$.

As described above, the fifth embodiment is capable of dynamically switching a plurality of circuit information items.

Sixth Embodiment

A nonvolatile programmable logic circuit according to a sixth embodiment will be described with reference to FIG. 23. The nonvolatile programmable logic circuit 100 is an FPGA as in the case of the fifth embodiment, and includes a plurality of basic blocks 110 arranged in an array form. Each basic block 110 is connected to adjacent basic blocks 110 with wiring lines, and includes a logic block 120 and a switch block 130. The logic block 120 performs logical operations basically using a look-up table containing a truth table.

Each switch block 130 controls the connection and the disconnection of the wiring lines connecting to adjacent basic blocks 110 so that signals are transmitted to given directions. Each switch block 130 also connects to the logic block 120 included in the relevant basic block 110 including the switch block 130. The logic block 120 and the switch block 130 are capable of controlling the connection based on data stored in a configuration memory of the programmable logic circuit.

The nonvolatile programmable logic switch according to any of the third embodiment, the fourth embodiment, and the modifications thereof is employed as the switch block 130 included in the nonvolatile programmable logic circuit according to the sixth embodiment.

Like the third embodiment, the fourth embodiment, and the modifications thereof, the sixth embodiment is capable of dynamically switching a plurality of circuit information items.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A nonvolatile memory comprising at least a memory cell, the memory cell including:
   a memory transistor including a source, a drain, a gate electrode disposed above a channel between the source and the drain, and a gate insulating layer disposed between the channel and the gate electrode;

a fuse element disposed between the gate electrode and a wiring line to which the gate electrode of the memory transistor is connected; and a write circuit that applies a program voltage between the wiring line and the source, and between the wiring line and the drain, wherein if the memory cell is programmed, both a conductive path between the source and the date electrode via the date insulating layer and a conductive path between the drain and the date electrode via the date insulating layer are formed, and the fuse element is blown out.

2. The memory according to claim 1, comprising a plurality of memory cells arranged in a matrix with rows and columns, the memory cells including the memory cell of claim 1.

3. The memory according to claim 2, further comprising:

a plurality of first wiring lines each corresponding to one of diagonal lines of the matrix, the other terminal of the fuse element in each of the memory cells arranged in one of the diagonal lines being connected to a corresponding one of the first wiring lines;

a plurality of second wiring lines each corresponding to one of the rows of the matrix, one of the source and the drain of the memory transistor in each of the memory cells arranged in one of the rows being connected to a corresponding one of the second wiring lines; and a plurality of third wiring lines each corresponding to one of the columns in the matrix, the other of the source and the drain of the memory transistor in each of the memory cells arranged in one of the columns being connected to a corresponding one of the third wiring lines.

4. The memory according to claim 3, further comprising:

a write circuit that selects one of the first wiring lines connected to the other terminal of the fuse element included in a memory cell to be programmed, and selects one of the second wiring lines and one of the third wiring lines to which the source and the drain of the memory transistor included in the memory cell to be programmed are connected, and applies a program voltage between the selected one of the first wiring lines and the source and between the selected one of the first wiring lines and the drain of the memory transistor included in the memory cell to be programmed.

5. A nonvolatile programmable logic circuit comprising a plurality of block units, each block unit including a logic block, and a switch block connected to the logic block, the logic block performing a logical operation, the switch block controlling a connection or disconnection between adjacent block units, and at least one of the logic block and the switch block including the nonvolatile memory according to claim 3.

6. The memory according to claim 2, wherein if one of the memory cells is programmed, both a conductive path between the source and the gate electrode via the gate insulating layer and a conductive path between the drain and the gate electrode via the gate insulating layer are formed in the programmed one of the memory cells, and the fuse element is blown out in the programmed one of the memory cells.

7. A nonvolatile programmable logic circuit comprising a plurality of block units, each block unit including a logic block, and a switch block connected to the logic block, the logic block performing a logical operation, the switch block controlling a connection or disconnection between adjacent block units, and at least one of the logic block and the switch block including the nonvolatile memory according to claim 2.

8. A nonvolatile memory comprising a plurality of memory cells arranged in a matrix with rows and columns, each memory cell including:

a memory transistor including a source, a drain, a gate electrode disposed above a channel between the source and the drain, and a gate insulating layer disposed between the channel and the gate electrode;

a fuse element, one terminal of which is connected to the gate electrode; and a plurality of wiring lines each corresponding to one of the columns, the other terminal of the fuse element in each memory cell being connected to a corresponding one of the wiring lines, the memory transistors of the memory cells in the same row being connected in series.

9. The memory according to claim 8, further comprising a write circuit that selects one of the wiring lines corresponding to a memory cell to be programmed, and applies a program voltage between the selected one of the wiring lines and the source and the drain of the memory transistor included in the memory cell to be programmed.

10. A nonvolatile memory comprising a plurality of memory cells arranged in a matrix with rows and columns, each memory cell including:

a memory transistor including a source, a drain, a gate electrode disposed above a channel between the source and the drain, and a gate insulating layer disposed between the channel and the gate electrode; and a fuse element, one terminal of which is connected to the gate electrode, wherein each memory cell further includes a first selection transistor and a second selection transistor, one of a source and a drain of the first selection transistor being connected to one of the source and the drain of the memory transistor, one of a source and a drain of the second selection transistor being connected to the one of the source and the drain of the first selection transistor and the one of the source and the drain of the memory transistor, the nonvolatile memory further comprising:

a plurality of program lines each corresponding to one of the rows, the other terminal of the fuse element included in each memory cell being connected to a corresponding one of the program lines;

a plurality of first selection lines each corresponding to one of the rows, a gate electrode of the first selection transistor included in each memory cell being connected to a corresponding one of the first selection lines;

a plurality of second selection lines each corresponding to one of the rows, a gate electrode of the second selection transistor included in each memory cell being connected to a corresponding one of the second selection lines;

a plurality of first wiring lines each corresponding to one of the rows, the other of the source and the drain of the second selection transistor included in each memory cell being connected to a corresponding one of the first wiring lines;

a plurality of second wiring lines each corresponding to one of the columns, the other of the source and the drain of the memory transistor included in each memory cell being connected to a corresponding one of the second wiring lines; and a plurality of third wiring lines each corresponding to one of the columns, the other of the source and the drain of the first selection transistor included in each memory cell being connected to a corresponding one of the third wiring lines.

11. The memory according to claim 10, further comprising a write circuit that selects one of the program lines to which the other terminal of the fuse element in a memory cell to be programmed is connected, one of the first selection lines to which the gate of the first selection transistor in the memory cell to be programmed is connected, one of the second wiring line to which the other of the source and the drain of the memory transistor in the memory cell to be programmed is connected, and one of the third wiring lines to which the other of the source and the drain of the first selection transistor in the memory cell to be programmed is connected, the write circuit further applying a first voltage to the selected one of the first selection lines to turn ON the first selection transistor, and applying a second voltage to the selected one of the second wiring lines and the selected one of the third wiring lines, and a third voltage to the selected one of the program lines to apply a program voltage between the selected one of the program lines and the source and between the selected one of the program lines and the drain of the memory transistor of the memory cell to be programmed.

12. A nonvolatile memory comprising a plurality of memory cells arranged in a matrix with rows and columns, each memory cell including:
    a first memory transistor including a source, a drain, a gate electrode disposed above a channel between the source and the drain, and a gate insulating layer disposed between the channel and the gate electrode; and
    a first fuse element, one terminal of which is connected to the gate electrode,
    wherein each memory cell further includes a second memory transistor and a second fuse element, the second memory transistor including a source, a drain, a gate electrode disposed above a channel between the source and the drain, and a gate insulating layer disposed between the channel and the gate electrode and connected to one terminal of the second fuse element, one of the source and the drain of the first memory transistor being connected to one of the source and the drain of the second memory transistor,
the nonvolatile memory further comprising:
a plurality of first wiring lines each corresponding to one of the rows, the other of the first fuse element included in each memory cell being connected to a corresponding one of the first wiring lines;
a plurality of second wiring lines each corresponding to one of the rows, the other terminal of the second fuse element included in each memory cell being connected to a corresponding one of the second wiring lines;
a plurality of third wiring lines each corresponding to one of the columns, the other of the source and the drain of the first memory transistor in each memory cell being connected to a corresponding one of the third wiring lines; and
a plurality of fourth wiring lines each corresponding to one of the columns, the other of the source and the drain of the second memory transistor in each memory cell being connected to a corresponding one of the fourth wiring lines.

13. The memory according to claim 12, further comprising a write circuit that selects one of the first memory transistor and the second memory transistor included in a memory cell to be programmed, and selects one of the first wiring lines to which the other terminal of the first fuse element included in the memory cell to be programmed is connected, one of the second wiring lines to which the other terminal of the second fuse element included in the memory cell to be programmed is connected, one of the third wiring line to which the other of the source and the drain of the first memory transistor included in the memory cell to be programmed is connected, and one of the fourth wiring lines to which the other of the source and the drain of the second memory transistor included in the memory cell to be programmed is connected, the write circuit further applying a first voltage to the selected one of the third wiring lines and the selected one of the fourth wiring lines, a second voltage to the selected one of the first wiring lines, and a third voltage to the selected one of the second wiring lines, thereby turning ON the other of the first memory transistor and the second memory transistor that is not selected in the memory cell to be programmed and applying a program voltage between the gate electrode and the source and between the gate electrode and the drain of the selected one of the first memory transistor and the second memory transistor.

14. A nonvolatile programmable logic switch including the nonvolatile memory according to claim 12, wherein each memory cell further includes a pass transistor of which a gate is connected to the one of the source and the drain of the first memory transistor and the one of the source and the drain of the second memory transistor.

15. A nonvolatile programmable logic switch comprising:
    a switch cell including a first memory cell, a second memory cell, and a pass transistor, each of the first memory cell and the second memory cell including a first memory transistor, a second memory transistor, a first fuse element corresponding to the first memory transistor, a second fuse element corresponding to the second memory transistor, and a selection transistor, each of the first memory transistor and the second memory transistor including a source, a drain, a gate electrode disposed above a channel between the source and the drain and connected to one terminal of a corresponding fuse element, and a gate insulating layer disposed between the channel and the gate electrode, one of the source and the drain of the first memory transistor being connected to one of the source and the drain of the second memory transistor, one of a source and a drain of the selection transistor being connected to one of the source and the drain of the first memory transistor and one of the source and the drain of the second memory transistor, and the other of the source and the drain of the selection transistor being connected to a gate of the pass transistor,
    first wiring lines corresponding to the first memory cell and the second memory cell, the other terminal of the first fuse element included in each of the first memory cell and the second memory cell being connected to a corresponding one of the first wiring lines;
    second wiring lines corresponding the first memory cell and the second memory cell, the other terminal of the second fuse element included in each of the first memory cell and the second memory cell being connected to a corresponding one of the second wiring lines;
    third wiring lines corresponding to the selection transistors included in the first memory cell and the second memory cell, a gate of each selection transistor being connected to a corresponding one of the third wiring lines;

a fourth wiring line connected to the other of the source and the drain of the first memory transistor in each of the first memory cell and the second memory cell;

a fifth wiring line connected to the other of the source and the drain of the second memory transistor in each of the first memory cell and the second memory cell; and a write circuit that selects one of the first memory transistor and the second memory transistor in the memory cell to be programmed, selects one of the first wiring lines to which the other terminal of the first fuse element in the memory cell to be programmed is connected, one of the second wiring lines, to which the other terminal of the second fuse element in the memory cell to be programmed is connected, the fourth wiring line to which the other of the source and the drain of the first memory transistor in the memory cell to be programmed is connected, and the fifth wiring line to which the other of the source and the drain of the second memory transistor in the memory cell to be programmed is connected, the write circuit further applying a first voltage to the fourth wiring line and the fifth wiring line, a second voltage to the selected one of the first wiring lines and a third voltage to the selected one of the second wiring lines, thereby turning ON the other of the first memory transistor and the second memory transistor that is not selected in the memory cell to be programmed, and applying a program voltage between the gate electrode and the source and between the gate electrode and the drain of the selected one of the first memory transistor and the second memory transistor.

16. The logic switch according to claim 15, wherein a conductive path is formed between the source and the drain via the gate insulating layer and the gate electrode of the selected one of the first memory transistor and the second memory transistor, and the fuse element connected to the gate electrode of the selected memory transistor is blown out in programmed one of the memory cells.

17. A nonvolatile programmable logic circuit comprising a plurality of block units, each block unit including a logic block, and a switch block connected to the logic block, the logic block performing a logical operation, the switch block controlling a connection or disconnection between adjacent block units, and at least one of the logic block and the switch block including the nonvolatile programmable logic switch according to claim 15.

* * * * *